(12) United States Patent
Russ et al.

(10) Patent No.: US 7,646,046 B2
(45) Date of Patent: Jan. 12, 2010

(54) FIELD EFFECT TRANSISTOR WITH A FIN STRUCTURE

(75) Inventors: Christian Russ, Diedorf (DE); Harald Gossner, Riemerling (DE); Thomas Schulz, Heverlee (DE)

(73) Assignee: Infineon Technologies AG (DE)

( * ) Notice: Subject to any disclaimer, the term of this patent is extended or adjusted under 35 U.S.C. 154(b) by 301 days.

(21) Appl. No.: 11/559,656

(22) Filed: Nov. 14, 2006

(65) Prior Publication Data

US 2008/0111163 A1 May 15, 2008

(51) Int. Cl.
*H01L 29/78* (2006.01)
(52) U.S. Cl. ..................................... 257/288
(58) Field of Classification Search .......... 257/288, 257/E21.45
See application file for complete search history.

(56) References Cited

U.S. PATENT DOCUMENTS

| 6,720,619 | B1 | 4/2004 | Chen et al. | |
|---|---|---|---|---|
| 6,787,845 | B2 | 9/2004 | Deleonibus | |
| 6,833,556 | B2 | 12/2004 | Grupp et al. | |
| 6,902,994 | B2 | 6/2005 | Gong et al. | |
| 6,929,992 | B1 | 8/2005 | Djomehri et al. | |
| 6,987,061 | B2 | 1/2006 | Mehrotra | |
| 2004/0036118 | A1* | 2/2004 | Abadeer et al. | 257/347 |
| 2004/0217408 | A1 | 11/2004 | Hofmann et al. | |
| 2005/0051825 | A1 | 3/2005 | Fujiwara et al. | |
| 2005/0072992 | A1 | 4/2005 | Lee et al. | |
| 2006/0001097 | A1 | 1/2006 | Nomura et al. | |
| 2006/0289920 | A1* | 12/2006 | Wu et al. | 257/310 |

FOREIGN PATENT DOCUMENTS

| DE | 101 37 217 A1 | 2/2003 |
|---|---|---|
| DE | 10 2004 057 504 A1 | 2/2006 |

* cited by examiner

*Primary Examiner*—Thao X Le
*Assistant Examiner*—Tanika Warrior
(74) *Attorney, Agent, or Firm*—Dickstein, Shapiro, LLP.

(57) ABSTRACT

A field effect transistor with a fin structure having a first and a second source/drain region; a body region formed within the fin structure and between the first and the second source/drain region; a metallically conductive region formed within a part of the first source/drain region, the metallically conductive region being adjacent to the body region or to a lightly doped region disposed between the body region and the first source/drain region; and a current ballasting region formed within a part of the second source/drain region.

30 Claims, 15 Drawing Sheets

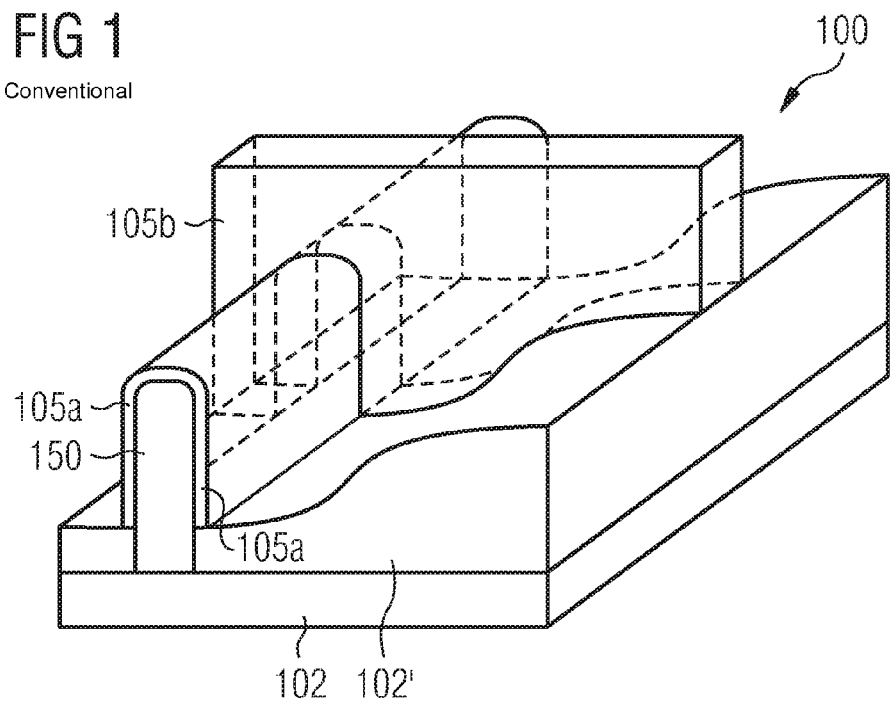
FIG 1
Conventional
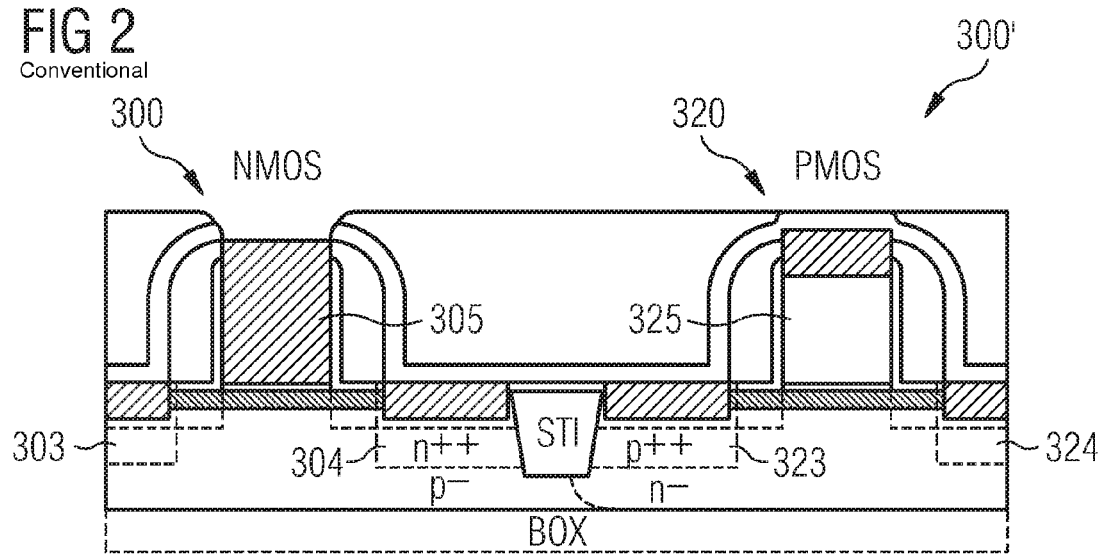
FIG 2
Conventional

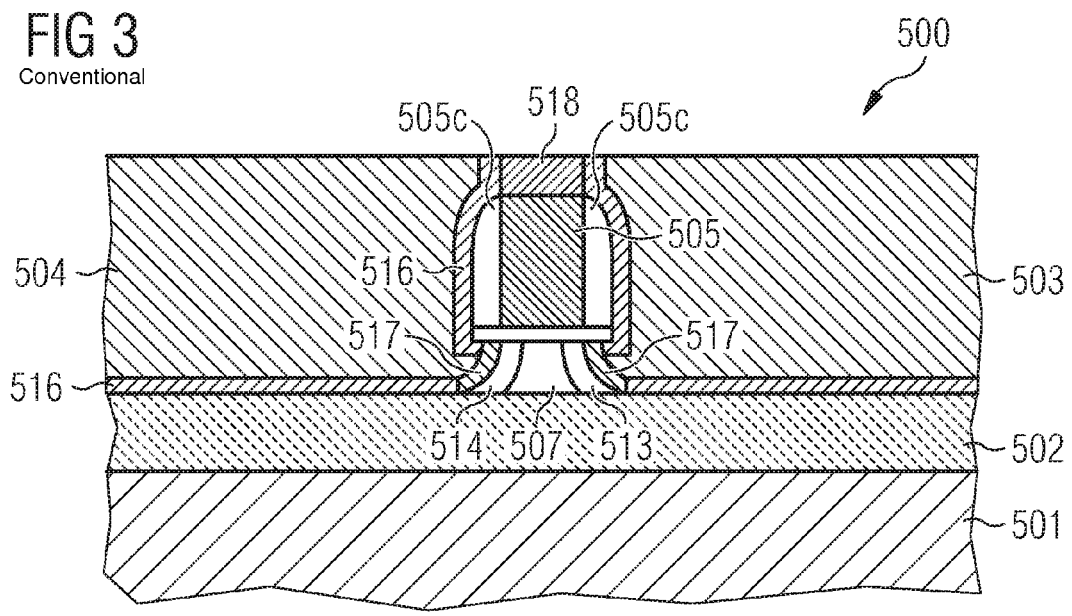
FIG 3
Conventional
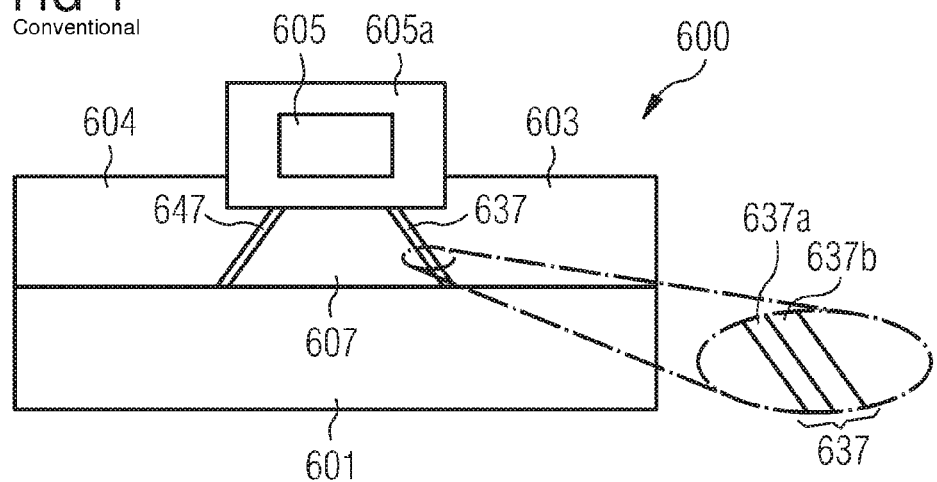
FIG 4
Conventional

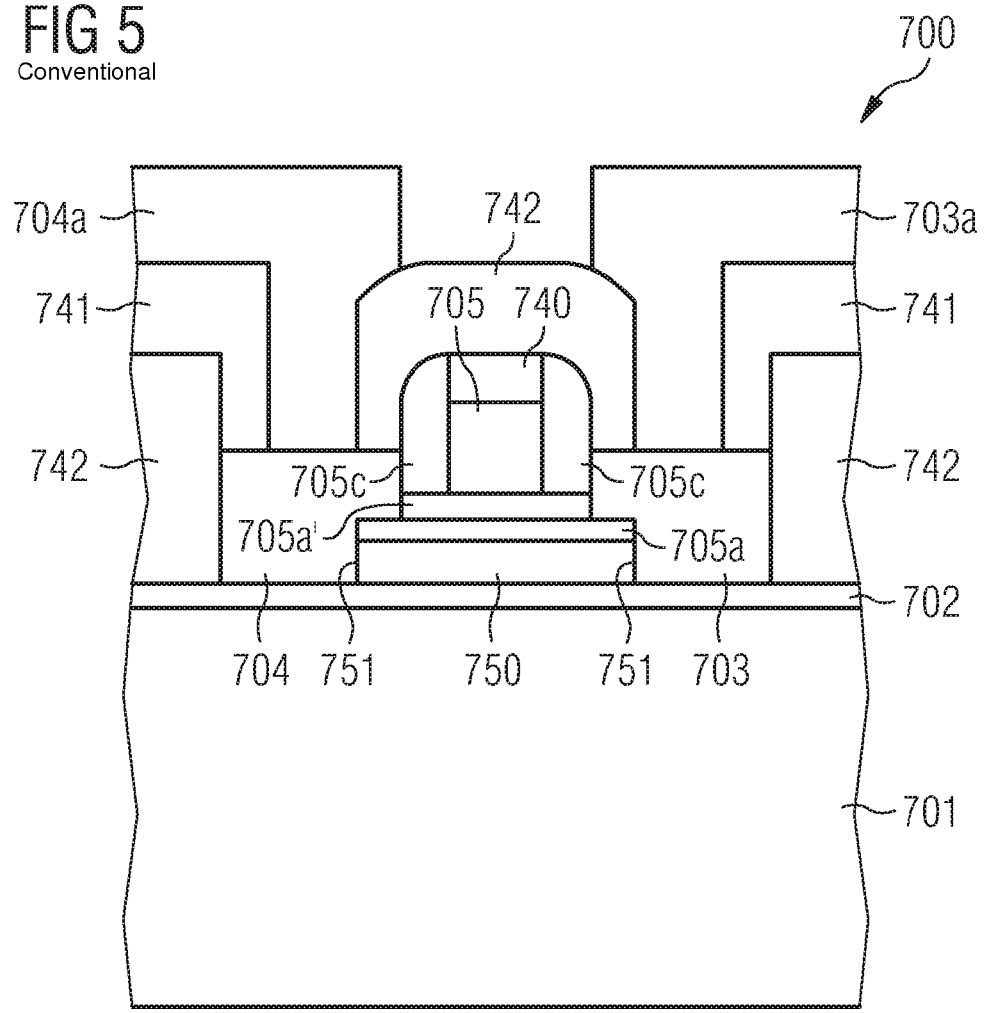

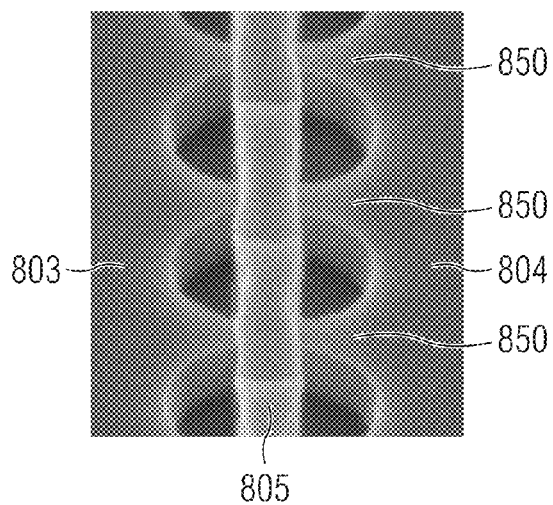
FIG 6A
Conventional
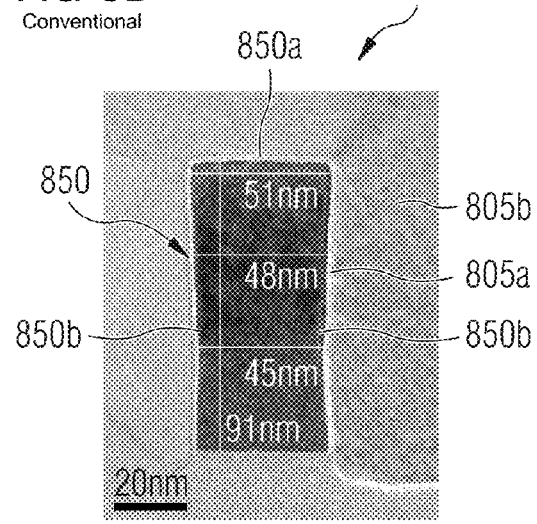
FIG 6B
Conventional
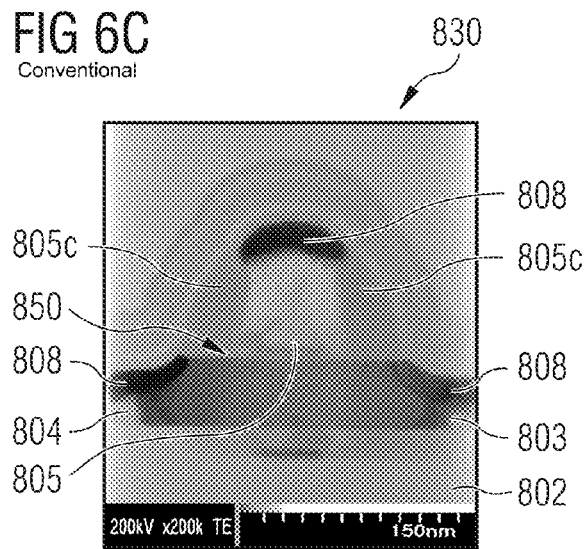
FIG 6C
Conventional

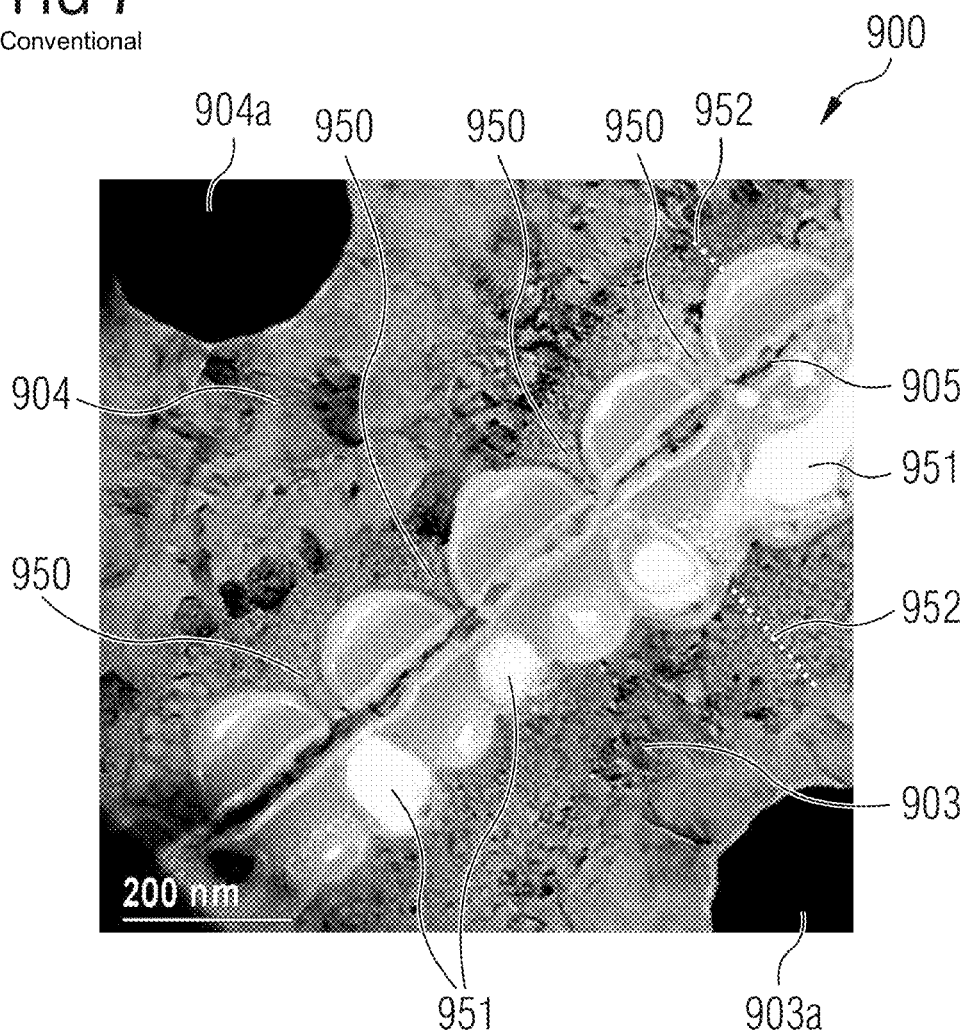

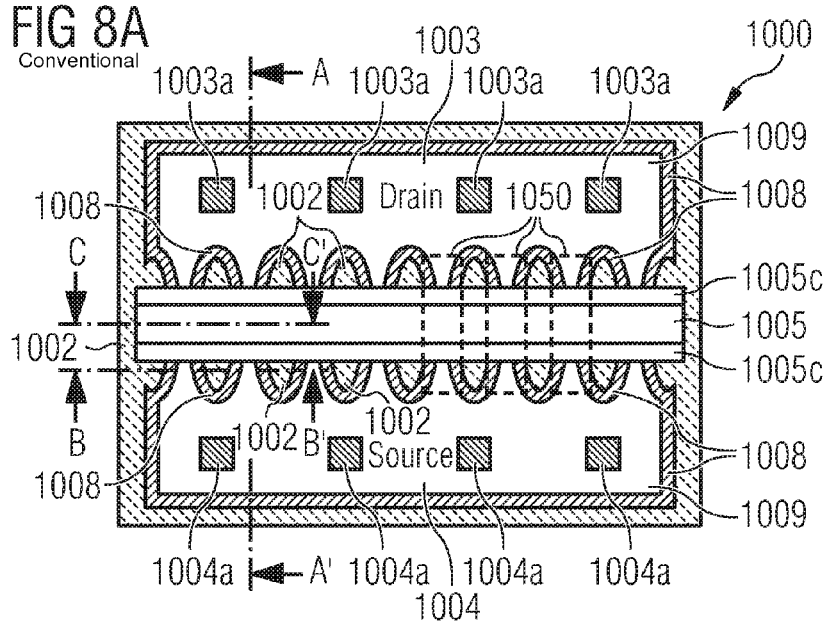
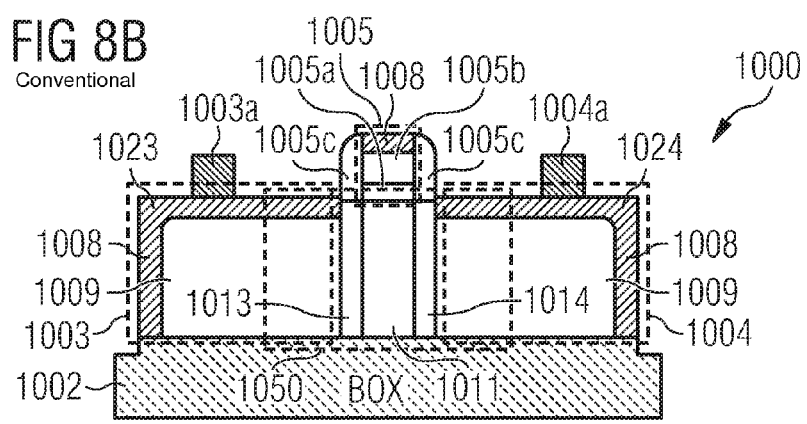
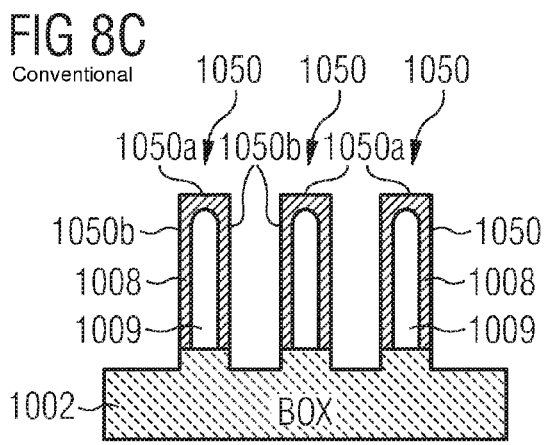
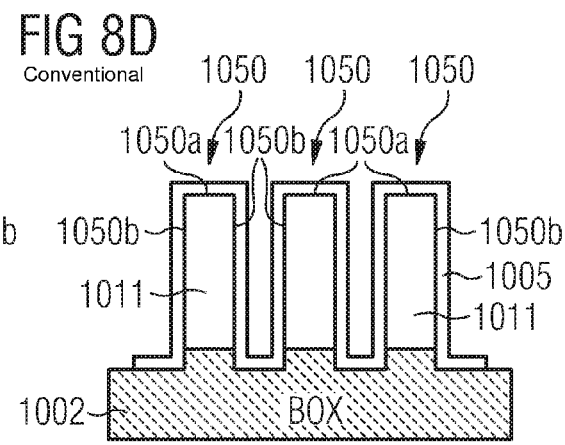

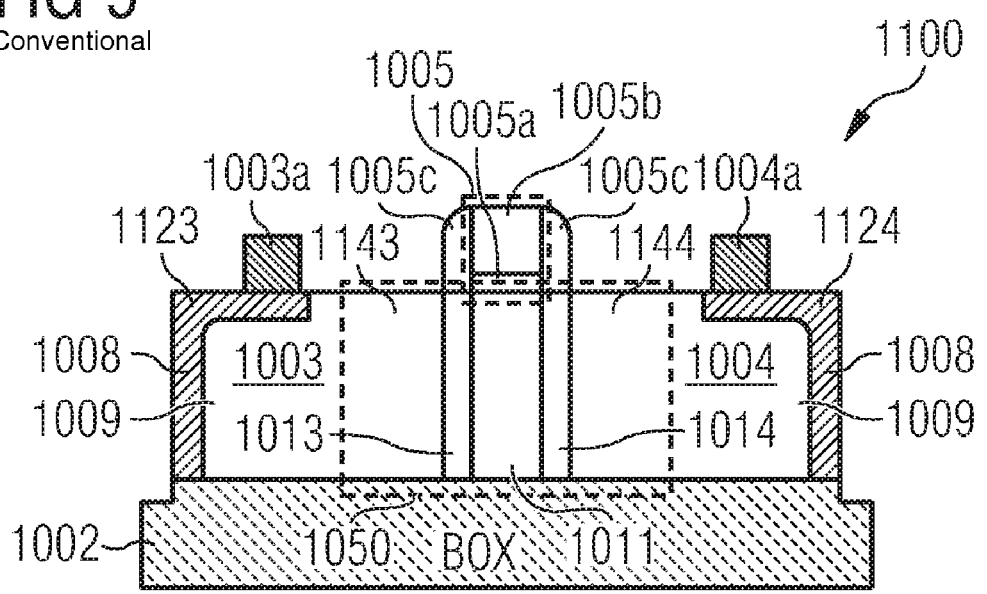
FIG 9
Conventional

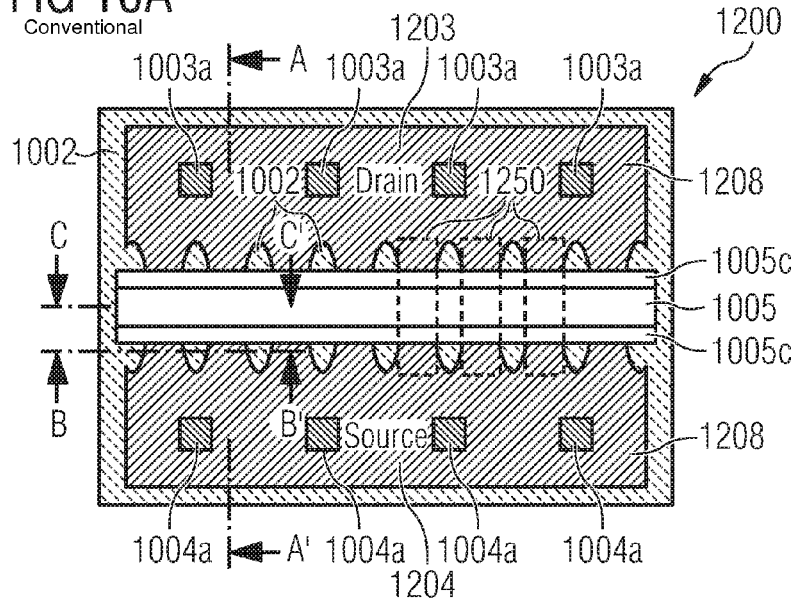
FIG 10A Conventional
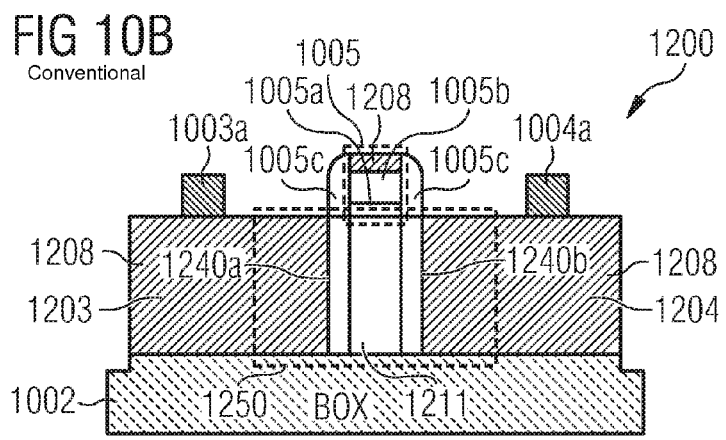
FIG 10B Conventional
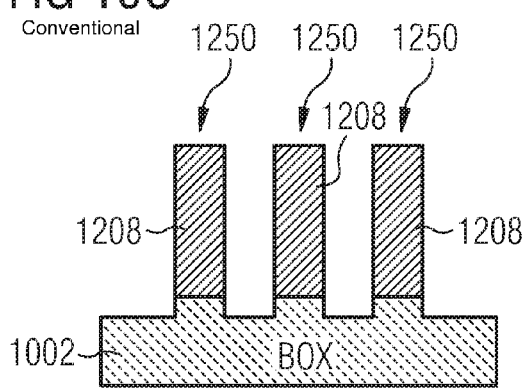
FIG 10C Conventional
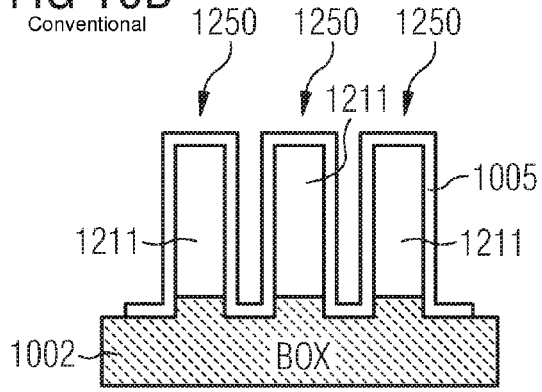
FIG 10D Conventional

FIELD EFFECT TRANSISTOR WITH A FIN STRUCTURE

FIELD OF THE INVENTION

The present invention relates generally to fin field effect transistor (FinFET) devices or multi-gate field effect transistor (MuGFET) devices.

BACKGROUND OF THE INVENTION

Fin field effect transistor (FinFET) devices or multi-gate field effect transistor (MuGFET) devices are expected to be used in the future due to the limited capability of downscaling of bulk CMOS technologies (CMOS: complementary metal oxide semiconductor). These MuGFET devices are typically designed for high-speed logic core applications featuring low supply voltages (e.g. 0.8 V to 1.2 V). In order to keep the process complexity low, FinFET or MuGFET devices with high ESD robustness (ESD: electrostatic discharge), e.g. for the typically higher IO supply voltages (e.g. 1.5 V to 2.5 V and higher), are needed without adding additional process steps.

SUMMARY OF THE INVENTION

A field effect transistor with a fin structure having a first and a second source/drain region; a body region formed within the fin structure and between the first and the second source/drain region; a metallically conductive region formed within a part of the first source/drain region, the metallically conductive region being adjacent to the body region or to a lightly doped region disposed between the body region and the first source/drain region; and a current ballasting region formed within a part of the second source/drain region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings in which:

FIG. 1 shows a conventional FinFET device;

FIG. 2 shows a conventional transistor arrangement including an NMOS device having a fully silicided gate;

FIG. 3 shows a conventional SOI MOS transistor having metal source/drain regions;

FIG. 4 shows a conventional field effect transistor having Schottky barriers in the channel;

FIG. 5 shows a conventional FinFET device having metallic source/drain regions;

FIG. 6A shows a plan-view SEM photograph of a conventional MuGFET device;

FIG. 6B shows a cross-sectional TEM photograph of a fin structure;

FIG. 6C shows a cross-sectional TEM photograph along the fin of another fin structure;

FIG. 7 shows a plan-view TEM photograph of another conventional and ESD-damaged MuGFET device;

FIG. 8A shows a schematic plan view of another conventional MuGFET device;

FIG. 8B to FIG. 8D show cross-sectional views of the MuGFET device shown in FIG. 8A;

FIG. 9 shows a schematic cross-sectional view of another conventional MuGFET device;

FIG. 10A shows a schematic plan view of another conventional MuGFET device;

FIG. 10B to FIG. 10D show cross-sectional views of the MuGFET device shown in FIG. 10A;

DETAILED DESCRIPTION OF EXEMPLARY EMBODIMENTS

Figure 11A:
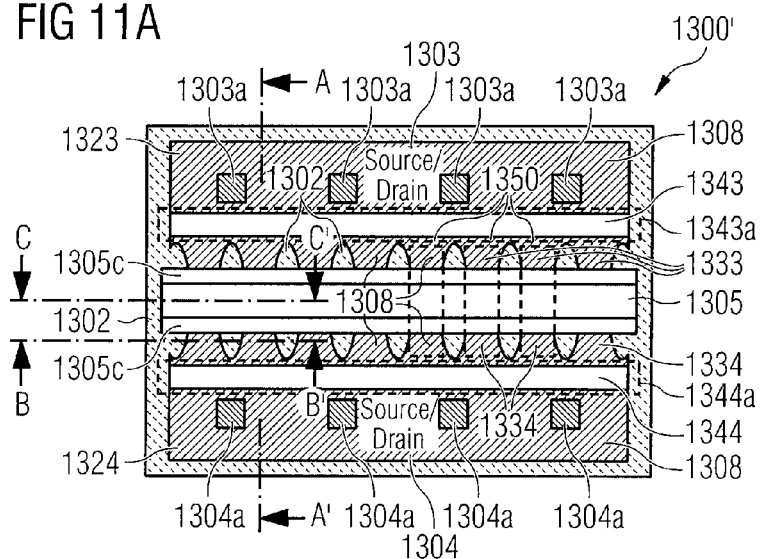
FIG. 11A shows a schematic plan view of a field effect transistor arrangement in accordance with an embodiment of the invention.

In the following description:

A fin structure or fin is understood to mean a ridge structure or a bridge structure which is formed or freely suspended on a substrate. The expressions fin structure or fin are used interchangeably hereinafter.

A fin field effect transistor (FinFET) is understood to mean a field effect transistor having a fin structure. A multi-gate field effect transistor (MuGFET) is understood to mean a fin field effect transistor, in which a channel region is driven from at least two sides. A MuGFET driven from three sides is also referred to as a triple gate field effect transistor or trigate field effect transistor.

The term "fully silicided" (also abbreviated as FuSi) or "fully silicided region" refers to a region (e.g. of a fin structure), the region being fully silicided or, in other words, being entirely transformed into a silicide.

The term "partially silicided" or "partially silicided region" refers to a region (e.g. of a fin structure), the region being silicided only in a surface area of the region, whereas a core region of the region remains unsilicided. Thus, the term "surface-silicided" is used as a synonym for "partially silicided". In the context of a fin structure, for example, the term "partially silicided" or "surface-silicided" is to be understood, that only the top surface and the sidewalls of the fin are silicided, while a core region of the fin remains unsilicided.

The term "selectively fully silicided" is to be understood that certain portions of a silicon film exist where the entire silicon film is transformed into a silicide, while other portions of the silicon film remain unsilicided silicon. In the context of a fin structure, for example, the term "selectively fully silicided" is to be understood, that certain portions (or sections)

of the fin are fully silicided, while other portions (or sections) of the fin are not fully silicided (e.g. unsilicided).

The term "current ballasting region" (or short: ballasting region) refers to a region providing a ballasting resistance in a current path and thus providing for uniform current spreading, e.g. during an electrostatic discharge (ESD) event. The terms "current ballasting region" and "ballasting region" are used interchangeably hereinafter.

The term "Schottky barrier junction" (also referred to as "Schottky barrier" or "Schottky junction" hereinafter) is understood to mean a metal-semiconductor junction, in other words a junction between a semiconducting region and a metallic region (or metallically conductive region including a silicide).

According to one embodiment of the invention a field effect transistor with a fin structure is provided. The field effect transistor includes a first source/drain region, a second source/drain region, a body region formed within the fin structure and between the first source/drain region and the second source/drain region. The field effect transistor further includes a metallically conductive region formed within a part of the first source/drain region, the metallically conductive region being adjacent to the body region or to a lightly doped region disposed between the body region and the first source/drain region. The field effect transistor further includes a current ballasting region formed within a part of the second source/drain region.

According to another embodiment of the invention the current ballasting region is adjacent to the body region or to a second lightly doped region disposed between the body region and the second source/drain region. That is, according to this embodiment the current ballasting region has a common interface with the body region or with the second lightly doped region.

According to another embodiment of the invention the field effect transistor includes a second metallically conductive region formed within a part of the second source/drain region, the second metallically conductive region being disposed between the current ballasting region and the body region.

According to another embodiment of the invention the second metallically conductive region is adjacent to the body region or to a second lightly doped region disposed between the body region and the second source/drain region.

According to another embodiment of the invention the current ballasting region is adjacent to the second metallically conductive region.

According to another embodiment of the invention the field effect transistor includes a second current ballasting region formed within a part of the first source/drain region.

According to another embodiment of the invention the metallically conductive region is disposed between the second current ballasting region and the body region or between the second current ballasting region and the lightly doped region.

According to another embodiment of the invention the second current ballasting region is adjacent to the metallically conductive region.

According to another embodiment of the invention at least one of the metallically conductive region and the second metallically conductive region includes a silicide material, e.g. titanium silicide, cobalt silicide, platinum silicide, tungsten silicide, molybdenum silicide, tantal silicide or nickel silicide. In other words, according to this embodiment the metallically conductive region or the second metallically conductive region or both of them includes/include silicide material.

According to another embodiment of the invention the metallically conductive region and/or the second metallically conductive region are/is formed as a fully silicided region.

According to another embodiment of the invention the metallically conductive region is formed as a silicided region in a surface area of the first source/drain region. In other words, according to this embodiment the metallically conductive region is formed as a silicided region only in the surface area of the first source/drain region, leaving a core region of the first source/drain region unsilicided. To put it in still other words, the first source/drain region includes a partially silicided (or surface-silicided) source/drain link region, the metallically conductive region forming the silicided portion of the surface-silicided source/drain link region.

According to another embodiment of the invention the second metallically conductive region is formed as a silicided region in a surface area of the second source/drain region. In other words, according to this embodiment the second metallically conductive region is formed as a silicided region only in the surface area of the second source/drain region, leaving a core region of the second source/drain region unsilicided. To put it in still other words, the second source/drain region includes a partially silicided (or surface-silicided) second source/drain link region, the second metallically conductive region forming the silicided portion of the surface-silicided second source/drain link region.

According to another embodiment of the invention the metallically conductive region is configured as a source/drain link region.

According to another embodiment of the invention the second metallically conductive region is configured as a second source/drain link region.

According to another embodiment of the invention the metallically conductive region is formed within the entirety of the first source/drain region. In other words, according to this embodiment the metallically conductive region is identical with the first source/drain region. To put it in still other words, the metallically conductive region includes the whole first source/drain region.

According to another embodiment of the invention the first source/drain region is formed as a fully silicided region. In other words, according to this embodiment the first source/drain region is fully silicided.

According to another embodiment of the invention the field effect transistor includes a lightly doped region disposed between the first source/drain region and the body region.

According to another embodiment of the invention the field effect transistor includes a second lightly doped region disposed between the second source/drain region and the body region.

According to another embodiment of the invention a Schottky barrier junction (Schottky barrier) is formed between the metallically conductive region and the body region. Alternatively, a Schottky barrier may be formed between the metallically conductive region and a lightly doped region disposed between the body region and the first source/drain region.

According to another embodiment of the invention a second Schottky barrier junction (second Schottky barrier) is formed between the second metallically conductive region and the body region. Alternatively, a second Schottky barrier may be formed between the second metallically conductive region and a second lightly doped region disposed between the body region and the second source/drain region.

According to another embodiment of the invention at least one of the lightly doped region and the second lightly doped region is formed as a halo region or as an extension region, in other words, as a region formed by a halo implantation or an extension implantation, respectively.

According to another embodiment of the invention at least one of the lightly doped region and the second lightly doped region is lightly doped (e.g. n– doped) with an n-type dopant such as, for example, phosphorus or arsenic.

According to another embodiment of the invention at least one of the lightly doped region and the second lightly doped region is lightly doped (e.g. p– doped) with a p-type dopant such as, for example, boron.

According to another embodiment of the invention at least one of the lightly doped region and the second lightly doped region has a dopant concentration of approximately $10^{18}$ $cm^{-3}$ to $10^{20}$ $cm^{-3}$.

According to another embodiment of the invention a Schottky barrier junction (Schottky barrier) is formed between the lightly doped region and the metallically conductive region.

According to another embodiment of the invention a second Schottky barrier junction (second Schottky barrier) is formed between the second lightly doped region and the second metallically conductive region.

According to another embodiment of the invention the fin structure or fin includes silicon material.

According to another embodiment of the invention the fin structure has a length of approximately 10 nm to 10 μm.

According to another embodiment of the invention the fin structure has a width of approximately 5 nm to 50 μm, e.g. 5 nm to 200 nm, for example 5 nm to 50 nm.

According to another embodiment of the invention the fin structure has a height of approximately 5 nm to 200 nm.

According to another embodiment of the invention the fin height is approximately three times the fin width.

According to another embodiment of the invention the fin structure is disposed on an insulating layer, e.g. an electrically insulating layer such as an oxide layer, e.g. a buried oxide (BOX) layer.

According to another embodiment of the invention the field effect transistor includes a source/drain contact region formed within a part of the first source/drain region, the source/drain contact region being adjacent to the second current ballasting region.

According to another embodiment of the invention the field effect transistor includes a second source/drain contact region formed within a part of the second source/drain region, the second source/drain contact region being adjacent to the current ballasting region.

According to another embodiment of the invention at least one of the source/drain contact region and the second source/drain contact region includes a metallically conductive material.

According to another embodiment of the invention at least one of the source/drain contact region and the second source/drain contact region includes a silicide material, e.g. titanium silicide, cobalt silicide, platinum silicide, tungsten silicide, molybdenum silicide, tantal silicide or nickel silicide.

According to another embodiment of the invention the source/drain contact region is formed in a surface area of the first source/drain region. In other words, according to this embodiment the source/drain contact region is formed as a silicided region only in the surface area of the first source/drain region, leaving a core region of the first source/drain region unsilicided. To put it in still other words, the source/drain contact region is formed as a surface-silicided region.

According to another embodiment of the invention the source/drain contact region is formed as a fully silicided region.

According to another embodiment of the invention the second source/drain contact region is formed in a surface area of the second source/drain region. In other words, according to this embodiment the second source/drain contact region is formed as a silicided region only in the surface area of the second source/drain region, leaving a core region of the second source/drain region unsilicided. To put it in still other words, the second source/drain contact region is formed as a surface-silicided region.

According to another embodiment of the invention the second source/drain contact region is formed as a fully silicided region.

According to another embodiment of the invention the field effect transistor includes at least one electrical contact disposed on at least one of the source/drain contact region and the second source/drain contact region.

According to another embodiment of the invention the field effect transistor includes an electrical contact disposed on the metallically conductive region.

According to another embodiment of the invention at least one of the current ballasting region and the second current ballasting region is heavily doped (e.g. n+ doped) with an n-type dopant such as, for example, phosphorus or arsenic.

According to another embodiment of the invention at least one of the current ballasting region and the second current ballasting region is heavily doped (e.g. p+ doped) with an p-type dopant such as, for example, boron.

According to another embodiment of the invention at least one of the current ballasting region and the second current ballasting region has a dopant concentration of approximately greater than $10^{20}$ $cm^{-3}$.

According to another embodiment of the invention the body region is doped, e.g. lightly p-doped (e.g. $p^-$-doped) with an p-type dopant such as, for example, boron.

According to another embodiment of the invention the body region has a dopant concentration of approximately less or equal to $10^{16}$ $cm^{-3}$.

According to another embodiment of the invention the body region is formed as a region with an intrinsic conductivity.

According to another embodiment of the invention the field effect transistor includes a gate region disposed on or above the body region.

According to another embodiment of the invention the gate region includes a gate-insulating layer, that is an electrically insulating layer, and a conductive gate layer disposed on the gate-insulating layer. The gate-insulating layer (also referred to as gate dielectric hereinafter) may include a suitable dielectric material, e.g. a gate oxide.

According to another embodiment of the invention the field effect transistor includes at least one spacer, e.g. a nitride spacer, formed adjacent to at least one sidewall of the gate region. Therefore, the terms "sidewall spacer" and "gate spacer" may also be used. The spacer(s) may be formed on the lightly doped region and/or on the second lightly doped region.

According to another embodiment of the invention the gate region or gate includes polysilicon material.

According to another embodiment of the invention the field effect transistor includes a silicide layer disposed on the gate region. In other words, according to this embodiment a top region of the conductive gate layer is silicided. To put it in still other words, according to this embodiment the gate is at least partially silicided.

According to another embodiment of the invention the source/drain regions and the gate region are silicided using separate silicidation processes. In other words, different processes are used for the silicidation of the gate and of the source/drain regions. This allows e.g. for more flexibility in the silicidation process.

According to another embodiment of the invention the source/drain regions and the gate are silicided using the same silicidation process. For example, in one embodiment, during silicidation of both the source/drain regions and the gate, a thin poly gate (polysilicon gate) may be fully silicided thereby forming a FuSi gate. In another embodiment, the gate may be formed as a thick poly gate which is not fully silicided during silicidation of both source/drain regions and the gate. In other words, in this embodiment, the gate is only partially silicided (or surface-silicided).

According to another embodiment, the gate region includes a thin metal gate and a poly gate disposed on or above the metal gate. In other words, in this embodiment the gate region has a two-layer structure including a metal gate and a polysilicon gate formed on or above the metal gate. The poly gate may be formed as a thick or as a thin poly gate and may be partially silicided or fully silicided as described above.

According to another embodiment of the invention the field effect transistor is configured as an NMOS field effect transistor.

According to another embodiment of the invention the field effect transistor is configured as a PMOS field effect transistor.

According to another embodiment of the invention a method of fabricating a field effect transistor is provided. The method includes forming a first source/drain region and a second source/drain region. The method further includes forming a body region within a fin structure of the field effect transistor, and between the first source/drain region and the second source/drain region. The method further includes forming a gate region on or above the body region. The method further includes forming a metallically conductive region within a part of the first source/drain region, the metallically conductive region being adjacent to the body region or to a lightly doped region formed between the body region and the first source/drain region. The method further includes forming a current ballasting region within a part of the second source/drain region.

According to one embodiment, in one process step of the method the body region is formed, in a subsequent process step the fin structure is formed, in a subsequent process step a gate region or gate is formed on the body region, in a subsequent process step the source/drain regions are formed, and in (a) subsequent process step(s) the source/drain regions and/or gate are silicided.

According to another embodiment of the invention a field effect transistor with a fin structure is provided. The field effect transistor includes a first source/drain region and a second source/drain region. The field effect transistor further includes a body region formed within the fin structure, and between the first source/drain region and the second source/drain region. The field effect transistor further includes a metallically conductive region formed within a surface area of the first source/drain region. The field effect transistor further includes a second metallically conductive region formed within a surface area of the second source/drain region. At least one of the first source/drain region and the second source/drain region includes at least one core region having a dopant concentration such that at least one Schottky barrier is formed between the at least one core region and at least one of the metallically conductive region and the second metallically conductive region.

According to another embodiment of the invention the first source/drain region includes a lightly doped core region, and the second source/drain region includes a second lightly doped core region. According to this embodiment, a Schottky barrier is formed between the lightly doped core region and the metallically conductive region, and a second Schottky barrier is formed between the second lightly doped core region and the second metallically conductive region.

According to another embodiment of the invention the first source/drain region includes a heavily doped core region, and the second source/drain region includes a lightly doped core region such that a Schottky barrier is formed between the lightly doped core region and the second metallically conductive region. In other words, according to this embodiment a Schottky barrier is formed only at the side of the second source/drain region. Alternatively, a Schottky barrier may be formed only at the side of the first source/drain region. That is, in this case the first source/drain region includes a lightly doped core region such that a Schottky barrier is formed between the lightly doped core region and the metallically conductive region, while the second source/drain region includes a heavily doped core region. Clearly, according to this embodiment the field effect transistor has an asymmetric design, wherein one of the first and the second source/drain region includes a lightly doped core region while the respective other one of the first and the second source/drain region includes a heavily doped core region, such that a Schottky barrier is formed on only one device side of the field effect transistor, i.e. between the lightly doped core region and the respective one of the metallically conductive region and the second metallically conductive region.

According to another embodiment of the invention the field effect transistor includes a lightly doped region disposed between the heavily doped core region and the body region.

According to another embodiment of the invention the first source/drain region and the second source/drain region of the field effect transistor include a core region, wherein the core region has approximately the same dopant concentration as the body region. According to this embodiment, a Schottky barrier is formed between the core region and the metallically conductive region, and a second Schottky barrier is formed between the core region and the second metallically conductive region. Clearly, according to this embodiment the field effect transistor includes one core region with an approximately homogeneous doping concentration, the core region being formed within the first and the second source/drain region, and also in the fin structure, wherein the body region can be seen as a part of the core region.

According to another embodiment of the invention the field effect transistor includes a first electrical contact disposed on the metallically conductive region for electrically contacting the first source/drain region, and a second electrical contact disposed on the second metallically conductive region for electrically contacting the second source/drain region.

According to another embodiment of the invention a method of fabricating a field effect transistor with a fin structure is provided. The method includes forming a first source/drain region and a second source/drain region. The method further includes forming a body region within the fin structure, and between the first source/drain region and the second source/drain region. The method further includes forming a gate region on or above the body region. The method further includes forming a metallically conductive region within a surface area of the first source/drain region. The method further includes forming a second metallically conductive region within a surface area of the second source/drain region, at least one of the first source/drain region and the second source/drain region including at least one core region having a dopant concentration such that at least one Schottky barrier is formed between the at least one core region and at least one of the metallically conductive region and the second metallically conductive region.

According to another embodiment of the invention a field effect transistor with a fin structure is provided. The field effect transistor includes a first source/drain region and a second source/drain region. The first source/drain region is formed as a metallically conductive region, and the second source/drain region is also formed as a metallically conductive region. The field effect transistor further includes a body region formed within the fin structure and between the first source/drain region and the second source/drain region. The first source/drain region is adjacent to a lightly doped region disposed between the body region and the first source/drain region, and the second source/drain region is adjacent to a second lightly doped region disposed between the body region and the second source/drain region.

According to another embodiment of the invention the first source/drain region is formed as a fully silicided region and the second source/drain region is also formed as a fully silicided region. In other words, both the first and the second source/drain region are fully silicided.

According to another embodiment of the invention a method of fabricating a field effect transistor with a fin structure is provided. The method includes forming a first source/drain region and a second source/drain region, the first source/drain region and the second source/drain region being formed as metallically conductive regions. The method further includes forming a body region within the fin structure and between the first source/drain region and the second source/drain region. The method further includes forming a lightly doped region between the body region and the first source/drain region, the first source/drain region being adjacent to the lightly doped region. The method further includes forming a second lightly doped region between the body region and the second source/drain region, the second source/drain region being adjacent to the second lightly doped region.

According to another embodiment of the invention a field effect transistor arrangement is provided. The field effect transistor arrangement includes a plurality of field effect transistors according to any one of the embodiments described herein, wherein the field effect transistors are electrically connected in parallel to one another.

According to another embodiment of the invention the field effect transistor arrangement includes a common first source/drain region and/or a common second source/drain region and/or a common gate region.

According to another embodiment of the invention, a common gate region is formed on the fin structures of the parallel field effect transistors of the field effect transistor arrangement.

According to another embodiment of the invention a method of fabricating an ESD-robust device is provided. The method includes selectively fully siliciding at least a part of a first source/drain region formed within a fin structure of the device. The method further includes blocking at least a part of a heavily doped part of a second source/drain region from silicidation, thereby forming a current ballasting region within the second source/drain region.

According to another embodiment of the invention the part of the heavily doped part of the second source/drain region is blocked from the selective silicidation.

According to another embodiment of the invention the selectively fully siliciding includes siliciding a part of the first source/drain region adjacent to a body region of the device or to a lightly doped region formed between the first source/drain region and the body region, thereby forming a Schottky barrier junction in the device.

According to another embodiment of the invention a method of fabricating an ESD-robust device further includes selectively fully siliciding a part of the second source/drain region adjacent to the body region or to a second lightly doped region formed between the second source/drain region and the body region, thereby forming a second Schottky barrier junction in the device.

According to another embodiment of the invention the method further includes blocking at least a part of a heavily doped part of the first source/drain region from silicidation, thereby forming a second current ballasting region within the first source/drain region.

According to another embodiment of the invention a method of siliciding a fin structure is provided. The method includes providing a fin structure having a predetermined value of the fin width. The method further includes siliciding at least a part of the fin structure, wherein the degree of silicidation of the silicided part of the fin structure is controlled by the value of the fin width. According to another embodiment the degree of silicidation of the silicided part of the fin structure alternatively or additionally is controlled by the material or materials used for silicidation. According to another embodiment, at least one of the following materials is used for siliciding the part of the fin structure: titanium, cobalt, nickel, platinum, tungsten, molybdenum, tantal.

Exemplary embodiments of the invention described herein in conjunction with the field effect transistor correspondingly also apply to the field effect transistor arrangement, the method of fabricating a field effect transistor, the method of fabricating an ESD-robust device and the method of siliciding a fin structure.

FIG. 1 shows a conventional FinFET device 100. The FinFET 100 includes a fin structure (fin) 150 which is disposed on a first insulating layer 102 above a substrate (not shown). A second insulating layer 102' is disposed on the first insulating layer 102, the fin 150 being partially embedded in the second insulating layer 102'. A gate dielectric 105a is disposed on the fin 150 (that is, on the top surface and on the sides of the fin 150), and a gate 105b is disposed on a portion of the gate dielectric 105a as well as on a portion of the second insulating layer 102'. The FinFET device 100 is adapted for standard supply voltages, but is not suitable for high IO supply voltages since i) its body is floating, ii) it has a high leakage current in the off-state, iii) it shows a gate-induced-drain-leakage (GIDL) and iv) it is sensitive to degradation by hot carrier generation (HCD).

It is known that a silicon gate can be fully silicided by means of a full silicidation process. It is further known that by siliciding the gates of NMOS and PMOS transistors separately and with different materials, different MOS threshold voltages can be obtained.

FIG. 2 shows a conventional transistor arrangement 300' based on an SOI technology, the arrangement 300' including an NMOS device 300 and a PMOS device 320 with the gates 305, 325 of the NMOS 300 and the PMOS 320 being separately silicided for different threshold voltages. The NMOS gate 305 is fully silicided whereas the PMOS gate 325 is not fully silicided. Also, the source/drain regions 303, 304 of the NMOS transistor 300 as well as the source/drain regions 323, 324 of the PMOS transistor 320 are silicided in the conventional way (i.e. not fully silicided).

Furthermore, metal source/drain regions are known for SOI technologies.

FIG. 3 shows a conventional MOS transistor 500 based on an SOI technology. The MOS transistor 500 is formed on an SOI substrate including a solid silicon part 501 and an insulating and buried oxide layer 502. A metallic bond layer 516 is formed on the insulating layer 502. The MOS transistor 500 further includes metal drain and source regions 503, 504. The transistor 500 further includes a drain extension region 513 and a source extension region 514. A silicide layer 517 is formed between the drain extension region 513 and the metal drain 503, and further between the source extension region 514 and the metal source 504. A channel region 507 is formed between the drain extension region 513 and the source extension region 514. A grid 505 is formed above the channel region 507, and between the metal drain 503 and the metal source 504. An electrically insulating layer 518 is formed on the grid 505. Insulating lateral spacers 505c are formed on the sides of the grid 505. The metallic bond layer 516 is also formed on the grid structure 505.

FIG. 4 shows a conventional field effect transistor (FET) 600 having Schottky barriers in the channel. The transistor 600 is formed on a substrate 601. The transistor 600 includes a silicon channel 607 that is separated from a source 604 and a drain 603 by interface layers 647 and 637, respectively, each of which form passivated Schottky barriers. The transistor 600 further includes a gate 605 surrounded by an insulator 605a. The Schottky barriers are formed between the metal source/drain regions 603, 604 and the silicon channel region 607. A passivated interface layer 637, including a passivation layer 637a and a separation layer 637b, is used for separating the drain 603 from the channel 607. The interface layers 637, 647 are not self-aligned with the gate 605.

FIG. 5 shows a conventional FinFET device 700 with metallic source/drain regions 703, 704 formed by silicide materials. Schottky barriers are formed between the source/drain regions 703, 704 and the channel. These Schottky barriers prevent underdiffusion of the source/drain dopants into the channel region and reduce series resistance by enabling a compact device design. Optionally a diffusion barrier (e.g. a thermal oxide) can be inserted in the Schottky regions. The transistor 700 is formed on an insulating layer 702 which is formed on a substrate 701. The transistor includes a metallic drain region 703 and a metallic source region 704. A fin structure 750 is formed on the insulating layer 702 between the drain region 703 and the source region 704 with the front ends 751 of the fin structure 750 facing the drain and source regions 703, 704. A nitride layer 705a is formed on the fin structure 750, and an oxide layer 705a' is formed on the nitride layer 705a. A gate 705 is formed on the oxide layer 705a', a protection layer 740 is formed on the gate 705, and spacers 705c are formed at the sidewalls of the gate 705. The source/drain regions 703, 704 are electrically contacted by electrical contacts 703a, 704a. The transistor 700 further includes a further protection layer 741 and insulating layers 742.

FIG. 6A shows a plan-view scanning electron microscopy (SEM) photograph of a conventional MuGFET 800 with a multi-fin structure including a plurality of fin structures 850 (denoted as "Fin" in FIG. 6A) electrically connected in parallel. The multi-fin structure of the MuGFET 800 includes a first common source/drain region 803 and a second common source/drain region 804. The multi-fin structure of the MuGFET 800 further includes a common gate 805 (denoted as "Gate" in FIG. 6A) which is formed on the top surface and the sidewalls of each fin 850 (cf. FIG. 6B). Clearly, the gate 805 is wrapped around the fins 850.

FIG. 6B is a transmission electron microscopy (TEM) photograph showing a transversal cross-sectional view 810 through a conventional fin structure 850. A thin dielectric layer 805a is formed on the top surface 850a and the sidewalls 850b of the fin structure 850, and an electrically conductive gate layer 805b is formed on the dielectric layer 805a, thereby enabling to control the conductivity of a channel region formed within the fin structure 850 under the gate. Clearly, a trigate structure is shown in FIG. 8B.

FIG. 6C is another TEM photograph, showing a longitudinal cross-sectional view 830 of a single fin structure 850 of a conventional MuGFET. The fin structure 850 is formed on a buried oxide (BOX) layer 802. From the photograph shown in FIG. 8D, it can be seen that a drain region 803 and a source region 804 as well as a gate region 805 of the MuGFET are silicided. In other words, a silicide layer 808 is formed in a top region of the drain region 803, in a top region of the source region 804, and in a top region of the gate 805. The silicide layer 808 includes nickel silicide. The height of the fin 850 is about 60 nm with the NiSi layer 808 having consumed approximately 30 nm to 40 nm of the fin 850. Nitride spacers 805c are formed at the sidewalls of the gate 805.

FIG. 7 is a plan-view TEM photograph showing the burnout of fin structures at the drain side in a conventional MuGFET device 900. The MuGFET 900 includes a multi-fin structure with a plurality of fin structures 950 (denoted as "Fin" in the FIG. 9), the fins 950 being electrically connected in parallel to one another. The multi-fin structure of the MuGFET 900 includes a common drain region 903 (denoted as "Drain" in FIG. 9) electrically contacted by a first electrical contact 903a, as well as a common source region 904 (denoted as "Source" in FIG. 9) electrically contacted by a second electrical contact 904a. The multi-fin structure of the MuGFET 900 further includes a common gate 905 (denoted as "Gate" in FIG. 9) formed on the top surface and the sidewalls of the fins 950.

The white spots 951 in the TEM photograph indicate the burnout of the fin structures 950 at the drain side 903 of the MuGFET 900. FIG. 9 shows that a MuGFET device (e.g. FinFET, TriGate, etc.) with silicon used for the source/drain regions and with a symmetrical source/drain design, such as the MuGFET 900, is not necessarily the best solution for an ESD-robust device (e.g. IO device). FIG. 9 shows that the drain side 903 of the device 900 is the weak point of the MUGFET device 900. The damage in each fin 950 is localized on the drain side 903 (white spots 951) with possible recrystallized regions 952 stretching further into the drain 903 and even source regions 904.

FIG. 8A shows a schematic plan-view of a conventional MuGFET device 1000 including a plurality of silicon fin structures (fins) 1050, a common drain region 1003 (denoted as "Drain" in FIG. 8A) and a common source region 1004 (denoted as "Source" in FIG. 8A). The MuGFET device 1000 is formed on a buried oxide (BOX) layer 1002. The drain region 1003 is electrically contacted by a plurality of first electrical contacts 1003a, and the source region 1004 is electrically contacted by a plurality of second electrical contacts 1004a. A gate region (gate) 1005 is formed on the plurality of fins 1050. In other words, the MuGFET 1000 includes a common gate 1005 which extends over all the fin structures 1050 of the MuGFET device 1000. The gate 1005 includes a gate-insulating layer 1005a and a conductive gate layer 1005b formed on the gate-insulating layer 1005a (not shown, see FIG. 8B). Spacers 1005c are formed at the sidewalls of the gate structure 1005. The MuGFET device 1000 is configured as a standard surface-silicided MuGFET device 1000 including a silicided source/drain contact region 1023 formed in a surface area of the drain region 1003, a silicided second source/drain contact region 1024 formed in a surface area of the source region 1004, and an unsilicided silicon core 1009 in each fin 1050, as can be seen in FIGS. 8B and 8C which show cross-sectional views along the dashed lines A-A' and B-B' in FIG. 8A, respectively. In other words, an unsilicided silicon core 1009 exists under the source/drain contact regions 1023, 1024 and inside the fin link regions (cf. FIG. 8B).

For a clearer illustration, FIG. 8A shows the surface silicidation of the source/drain regions 1003, 1004 (represented by a silicide layer 1008 "framing" the drain region 1003 and the source region 1004), as well as the unsilicided silicon core 1009 underneath, which in a plan view would actually be concealed from view by the silicide layer 1008 (cf. FIG. 8B).

FIG. 8B shows a longitudinal cross-sectional view of the MuGFET device 1000 of FIG. 8A along the dashed line A-A' shown in FIG. 8A. In other words, FIG. 8B shows a cross-sectional view along the longitudinal axis of one of the fins 1050 of the MuGFET device 1000 shown in FIG. 8A. FIG. 8B shows that a body region 1011 is formed within the fin structure 1050 under the gate region 1005, and that lightly doped halo or extension regions 1013, 1014 are formed adjacent to the body region 1011. A first halo/extension region 1013 is formed between the body region 1011 and the drain region 1003, and a second halo/extension region 1014 is formed between the body region 1011 and the source region 1004. The gate structure 1005 includes the gate-insulating layer 1005a which is formed on the body region 1011, and the conductive gate layer 1005b which is formed on the gate-insulating layer 1005a. The drain region 1003 as well as the source region 1004 are surface-silicided. That is, a silicide layer 1008 is formed on the top surface and the sidewalls of the fin 1050, thereby forming the silicided source/drain contact regions 1023, 1024 and leaving a highly doped (e.g. N+ doped) silicon core 1009 both in the drain region 1003 and in the source region 1004 (cf. FIG. 8C). In addition, the gate 1005 is silicided. In other words, a silicide layer 1008 is also formed on the conductive gate layer 1005b of the gate 1005. Note, that for clarity of illustration the gate silicide layer is not shown in the plan-view of FIG. 8A.

FIG. 8C shows a cross-sectional view of the MuGFET device 1000 of FIG. 8A along the dashed line B-B' shown in FIG. 8A. Clearly, a cross-sectional view through the source/drain (or fin) link regions of a plurality of neighboring fin structures 1050 of the MuGFET device 1000 is shown. From FIG. 8C it can be seen that the fin structures 1050 are partially silicided, that is a surface area of each fin 1050 is covered with silicide 1008, thereby forming silicided source/drain contact regions 1023 in each fin (cf. FIG. 8B) while leaving a core region 1009 of the fin 1050 unsilicided. In other words, the silicide 1008 is only formed at (or near) the top surface 1050a and the sidewalls 1050b of each fin 1050, while the silicon core 1009 of each fin 1050 is not silicided.

FIG. 8D shows a cross-sectional view of the MuGFET device 1000 of FIG. 8A along the dashed line C-C' shown in FIG. 8A. In other words, a transversal cross-section through neighboring fin structures 1050 of the plurality of fin structures 1050, that is through the body regions 1011 of the respective fin structures 1050, is shown. It can be seen, that the gate region 1005 is formed on the body regions 1011 of the respective fins 1050. The gate 1005 is formed on the top surface 1050a and the sidewalls 1050b of each fin 1050.

Note, that for clarity of illustration the gate-insulating layer 1005a, the conductive gate layer 1005b as well as the gate silicide 1008 are not shown in FIG. 8D. The body region 1011 of each fin 1050 includes silicon material with any doping. During the on-state of the MuGFET 1000, a conductive channel is formed in the body region 1011 under the gate region 1005.

Clearly, FIGS. 8A to 8D show a conventional FinFET device type including partially or surface-silicided source/drain (S/D) regions 1003, 1004. In other words, silicided source/drain (S/D) contact regions 1023 and 1024 are formed in surface areas of the source/drain regions 1003 and 1004, respectively. The S/D contact regions 1023, 1024 are formed in surface areas of the source/drain regions 1003, 1004 leaving highly N+ doped silicon core regions 1009 inside the fin 1050. Under the gate sidewall spacers 1005c, more lightly doped (e.g. N− doped) halo/extension regions 1013, 1014 are formed. The silicide 1008 is only formed on the top surface 1050a and the sidewalls 1050b of the fin 1050, while the core 1009 of the fin 1050 must not be silicided to ensure an ohmic contact from the silicide to the n-doped S/D regions 1003, 1004 as desired for standard MOS device performance.

The device type shown in FIGS. 8A to 8D can also be formed in a similar manner in bulk technologies.

If silicide blocking is applied for standard improved ESD hardness, the cross-section along the longitudinal axis of the fins 1050 (that is, the cross-section along the dashed line A-A') will yield the device structure 1100 shown in FIG. 9.

In the MuGFET device 1100 shown in FIG. 9, portions of the source/drain regions 1003, 1004 between the contacts 1003a, 1004a and the gate region 1005 are not covered with silicide 1008 to provide ballasting resistance as known from bulk technologies. That is, FIG. 9 shows a conventional silicide-blocked FinFET device 1100, the FinFET device 1100 including surface-silicided source/drain contact regions 1123 and 1124 as well as highly doped (N+ doped) silicide-blocked ballasting regions 1143 and 1144 within the drain region 1003 and the source region 1004, respectively. The ultra-low thermal mass as determined by the small geometry of each fin 1050 in this FinFET device 1100 (as well as in the FinFET device 1000) may lead to early ESD failure of the device 1100. Furthermore, the gate 1005 of the FinFET structure 1100 is typically not silicided (as shown in FIG. 9), making the device 1100 not suitable for ultra-high speed applications due to an increased RC delay of the gate 1005.

FIG. 10A shows a schematic plan-view of another conventional MuGFET device 1200 including a multi-fin structure with a plurality of silicon fin structures (fins) 1250, and further including a common drain region 1203 (denoted as "Drain") and a common source region 1204 (denoted as "Source").

FIG. 10B shows a longitudinal cross-sectional view along the dashed line A-A' in FIG. 10A, that is, a cross-sectional view along the longitudinal axis of a fin structure 1250, while FIG. 10C and FIG. 10D show cross-sectional views along the dashed lines B-B' and C-C' in FIG. 10A, respectively. The MuGFET device 1200 is different from the MuGFET device 1000 shown in FIGS. 8A to 8D, in that the drain region 1203 and the source region 1204 of the MuGFET 1200 are fully silicided. In other words, the drain region 1203 and the source region 1204 of the MuGFET device 1200 are entirely transformed into a silicide 1208, such that, in contrast to the device 1000 shown in FIGS. 8A to 8D, no silicon core remains in the fins 1250 of the MuGFET 1200. Furthermore, the MuGFET 1200 lacks halo/extension regions. The MuGFET device 1200 includes a Schottky barrier junction 1240a, formed between the silicided drain region 1203 and a body region 1211 (including silicon of any doping) of the MuGFET 1200, as well as a second Schottky barrier junction 1240b formed between the silicided source region 1204 and the body region 1211. In other words, Schottky barriers 1240a, 1240b replace the conventional pn-junctions of the device 1000 shown in FIGS. 8A to 8D.

FIG. 11A shows a schematic plan-view of a field effect transistor arrangement 1300' in accordance with an exemplary embodiment of the invention. The field effect transistor arrangement 1300' includes a plurality of field effect transistors 1300 (cf. FIG. 11B) being electrically connected in parallel to one another. Each one of the field effect transistors 1300 includes a fin structure 1350. In other words, the field effect transistor arrangement 1300' includes a multi-fin structure, the multi-fin structure having a plurality of parallel fin structures 1350.

The field effect transistor arrangement 1300' is formed on an electrically insulating layer 1302, according to the embodiment shown, on a buried oxide (BOX) layer 1302. The field effect transistor arrangement 1300' includes a first common source/drain region 1303 (denoted as "Source/Drain" in FIG. 11A), a second common source/drain region 1304 (denoted as "Source/Drain" in FIG. 11A) and a common gate region 1305. The gate region or gate 1305 is formed on the plurality of parallel fin structures 1350. In other words, the gate 1305 extends over all the fin structures (fins) 1350 of the field effect transistor arrangement 1300'. The gate region 1305 includes a gate-insulating layer (or gate dielectric layer) 1305a formed on the fin structures 1350, and a conductive gate layer 1305b formed on the gate-insulating layer 1305a (not shown in FIG. 11A, see FIG. 11B). Spacers 1305c are formed at the sidewalls of the gate structure 1305. The first source/drain region 1303 is electrically contacted by a plurality of first electrical contacts 1303a, and the second source/drain region 1304 is electrically contacted by a plurality of second electrical contacts 1304a. Spacers 1305c are formed at the sidewalls of the gate region 1305.

Figure 11B:
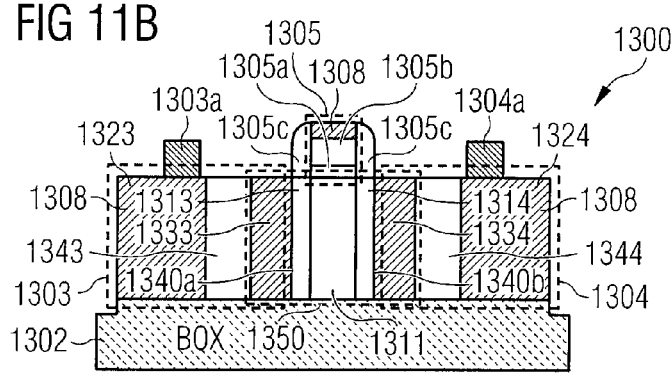
FIG. 11B to FIG. 11D show cross-sectional views of the field effect transistor arrangement shown in FIG. 11A.

FIG. 11B shows a cross-sectional view along the dashed line A-A' in FIG. 11A. In other words, a cross-section along the longitudinal axis of the fin structure 1350 of one of the field effect transistors 1300 of the field effect transistor arrangement 1300' is shown. It is shown in FIG. 11B, that the field effect transistor 1300 includes a body region 1311 formed within the fin structure 1350 and between the first source/drain region 1303 and the second source/drain region 1304 of the field effect transistor 1300. According to the embodiment shown, a lightly doped region 1313 is disposed between the body region 1311 and the first source/drain region 1303, and a second lightly doped region 1314 is disposed between the body region 1311 and the second source/drain region 1304. In alternative embodiments, the lightly doped region 1313 and/or the second lightly doped region 1314 may be omitted. The lightly doped region 1313 and/or the second lightly doped region 1314 may be formed, for example, as a halo region or as an extension region.

The gate 1305 is formed on the body region 1311. That is, the gate-insulating layer 1305a is formed on the body region 1311 and the electrically conductive gate layer 1305b is formed on the gate-insulating layer 1305a. The gate 1305 is silicided. In other words, a silicide layer 1308 is formed on the conductive gate layer 1305b of the gate 1305. According to an alternative embodiment, the gate 1305 may be fully silicided. Note, that for clarity of illustration the gate silicide layer is not shown in the plan-view of FIG. 11A. The gate sidewall spacers 1305c are disposed on the lightly doped region 1313 and on the second lightly doped region 1314.

The field effect transistor 1300 further includes a metallically conductive region 1333 formed within a part of the first source/drain region 1303. The metallically conductive region 1333 is formed adjacent to the lightly doped region 1313 (for example, adjacent to the halo or extension region 1313). In other words, the metallically conductive region 1333 and the lightly doped region 1313 include a common interface. According to another embodiment of the invention, the metallically conductive region 1333 may be formed adjacent to the body region 1311 (for example, in case that no lightly doped region 1313 is formed adjacent to the body region 1311).

The field effect transistor 1300 further includes a current ballasting region 1344 formed within a part of the second source/drain region 1304. The field effect transistor 1300 further includes a second metallically conductive region 1334 formed within a part of the second source/drain region 1304. The second metallically conductive region 1334 is formed adjacent to the second lightly doped region 1314 (for example, adjacent to the second halo region or extension region 1314). In other words, the second metallically conductive region 1334 and the second lightly doped region 1314 include a common interface. According to another embodiment, the second metallically conductive region 1334 may be formed adjacent to the body region 1311 (for example, in case that no second lightly doped region 1314 is formed adjacent to the body region 1311).

The field effect transistor 1300 further includes a second current ballasting region 1343 formed within a part of the first source/drain region 1303. The current ballasting region 1344 and the second current ballasting region 1343 are formed as highly doped (for example, n+ doped in case of an NMOS field effect transistor, or p+ doped in case of a PMOS field effect transistor) ballasting regions.

The field effect transistor 1300 further includes a source/drain contact region 1323 formed within a part of the first source/drain region 1303 adjacent to the second current ballasting region 1343. A first electrical contact 1303a is formed on the source/drain contact region 1323, for electrically contacting the first source/drain region 1303.

The field effect transistor 1300 further includes a second source/drain contact region 1324 formed within a part of the second source/drain region 1304 adjacent to the current ballasting region 1344. A second electrical contact 1304a is formed on the second source/drain contact region 1324, for electrically contacting the second source/drain region 1304.

The metallically conductive region 1333 and the second metallically conductive region 1334 are each formed as a fully silicided region. The fully silicided regions 1333 and 1334 may serve as a first source/drain link region 1333 and as a second source/drain link region 1334, respectively. Also, the source/drain contact region 1323 and the second source/drain contact region 1324 are formed as fully silicided regions.

Clearly, the field effect transistor 1300 includes a structure with selectively fully silicided source/drain regions 1303, 1304. In other words, certain portions (or sections) of the first source/drain region 1303 and the second source/drain region 1304 are fully silicided (namely the metallically conductive regions 1333, 1334 (source/drain link regions 1333, 1334) and the source/drain contact regions 1323, 1324) while other portions (or sections) of the first source/drain region 1303 and the second source/drain region 1304 are not silicided (namely the second current ballasting region 1343 and the current ballasting region 1344). That is, the source/drain link regions 1333, 1334 and the source/drain contact regions 1323, 1324 are selectively fully silicided while the current ballasting region 1344 and the second current ballasting region 1343 are blocked from the silicidation, for example, by means of a silicide blocking mask. The silicide-blocking is represented by the dashed lines 1343a and 1344a in FIG. 11A.

By blocking the formation of silicide in the areas denoted by the dashed lines 1343a and 1344a in FIG. 11A, an electrical ballasting resistance is created in the first source/drain region 1303 and in the second source/drain region 1304 of each transistor 1300 for uniform current spreading during an ESD event.

Furthermore, by forming a fully silicided source/drain link region 1333 adjacent to the lightly doped region 1313, a Schottky barrier 1340*a* is formed between the lightly doped region 1313 and the metallically conductive region 1333. Analogously, by forming a fully silicided second source/drain link region 1334 adjacent to the second lightly doped region 1314, a second Schottky barrier 1340*b* is formed between the second lightly doped region 1314 and the second metallically conductive region 1334. In other words, Schottky barriers 1340*a*, 1340*b* are formed between the source/drain regions 1303, 1304 and a channel region formed under the gate 1305 within the body region 1311 and/or within the lightly doped regions 1313, 1314. Clearly, the field effect transistor arrangement 1300' and/or the corresponding field effect transistors 1300 have/has a symmetric device design.

Figure 11C:
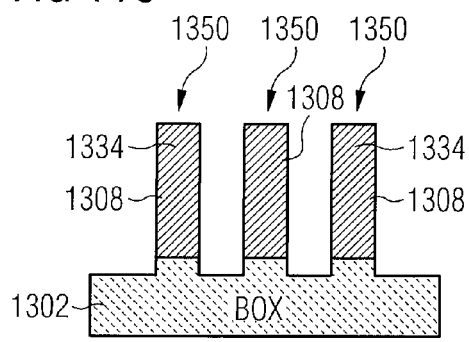

FIG. 11C shows a cross-sectional view of the field effect transistor arrangement 1300' of FIG. 11A along the dashed line B-B' shown in FIG. 11A. That is, a cross-sectional view through the second source/drain (or fin) link regions 1334 of a plurality of neighboring fin structures 1350 of the field effect transistor arrangement 1300' is shown. From FIG. 11C it can be seen that the second metallically conductive regions 1334 (second source/drain link regions 1334) of the fin structures 1350 are each fully silicided, i.e. the second source/drain link regions 1334 are entirely transformed into a silicide 1308. The same holds true for the metallically conductive regions 1333 (source/drain link regions 1333) of the fins 1350, as would be seen in an equivalent cross-section through the source/drain link regions 1333 (not shown).

Figure 11D:
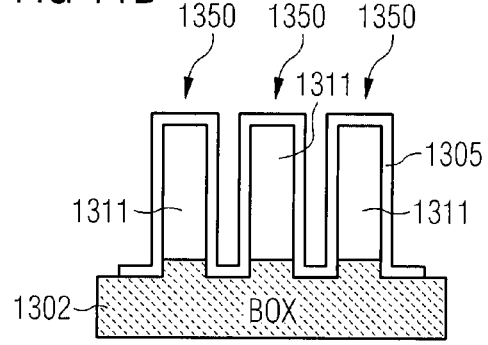

FIG. 11D shows a cross-sectional view of the field effect transistor arrangement 1300' of FIG. 11A along the dashed line C-C' shown in FIG. 11A. In other words, a transversal cross-section through neighboring fin structures 1350 of the plurality of fin structures 1350, that is through the body regions 1311 of the respective fin structures 1350, is shown. It can be seen, that the gate region 1305 is formed on the body regions 1311 of the respective fins 1350. The body region 1311 of each fin 1350 may, for example, include silicon material with any doping type. The doping concentration may, for example, be chosen to be approximately less or equal to $10^{18}$ cm$^{-3}$ such that Schottky barriers 1340*a*, 1340*b* (cf. FIG. 11B) are formed. The gate 1305 is formed on the top surface 1350*a* and the sidewalls 1350*b* of each fin 1350. Note, that for clarity of illustration the gate-insulating layer 1305*a*, the conductive gate layer 1305*b* as well as the gate silicide 1308 are not shown in FIG. 11D. During the on-state of the field effect transistor 1300, a conductive channel may be formed in the body region 1311 under the gate region 1305.

Figure 12A:
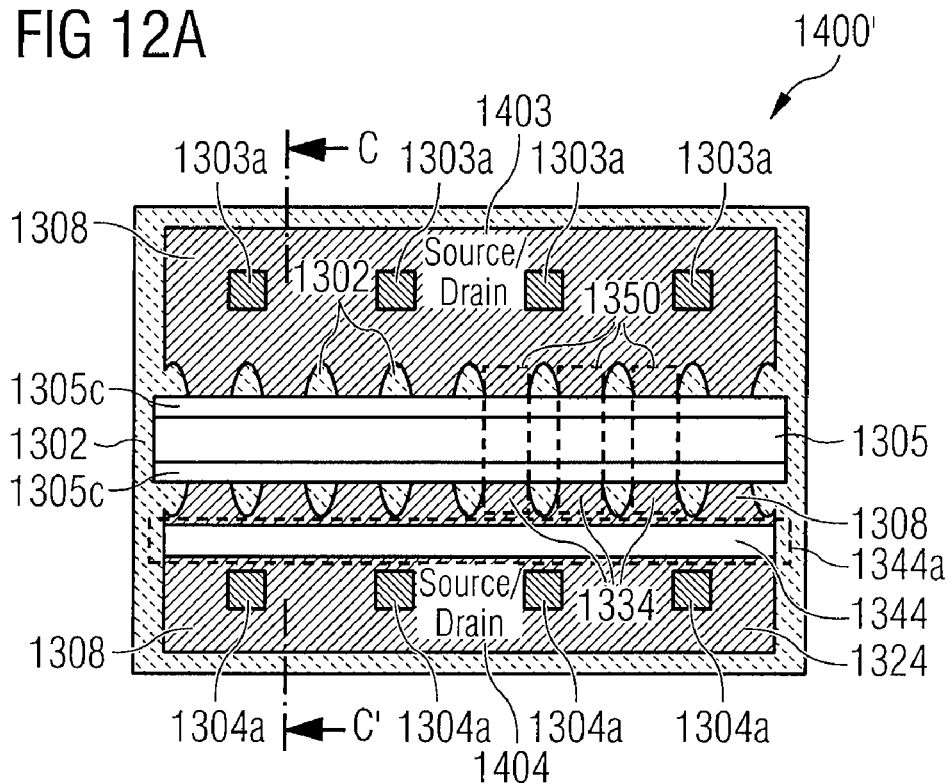
FIG. 12A shows a schematic plan view of a field effect transistor arrangement in accordance with an embodiment of the invention.

FIG. 12A shows a schematic plan-view of a field effect transistor arrangement 1400' in accordance with another embodiment of the invention. The field effect transistor arrangement 1400' includes a plurality of field effect transistors 1400, electrically connected in parallel to one another, one of the field effect transistors 1400 being shown in FIG. 12B which is a cross-sectional view of the field effect transistor arrangement 1400' along the dashed line C-C' in FIG. 12A, that is along the longitudinal axis of one of the plurality of fin structures 1350 of the field effect transistor arrangement 1400'. The field effect transistor arrangement 1400' includes a first common source/drain region 1403 (denoted as "Source/Drain" in FIG. 12A) and a second common source/drain region 1404 (denoted as "Source/Drain" in FIG. 12A).

The field effect transistor arrangement 1400' is different from the field effect transistor arrangement 1300' shown in FIG. 11A, in that the first source/drain region 1403 is formed as a fully silicided source/drain region. In other words, the drain region 1403 is entirely transformed into a silicide 1308. Thus, the fully silicided first source/drain region 1403 forms the metallically conductive region of the field effect transistor 1400.

Figure 12B:
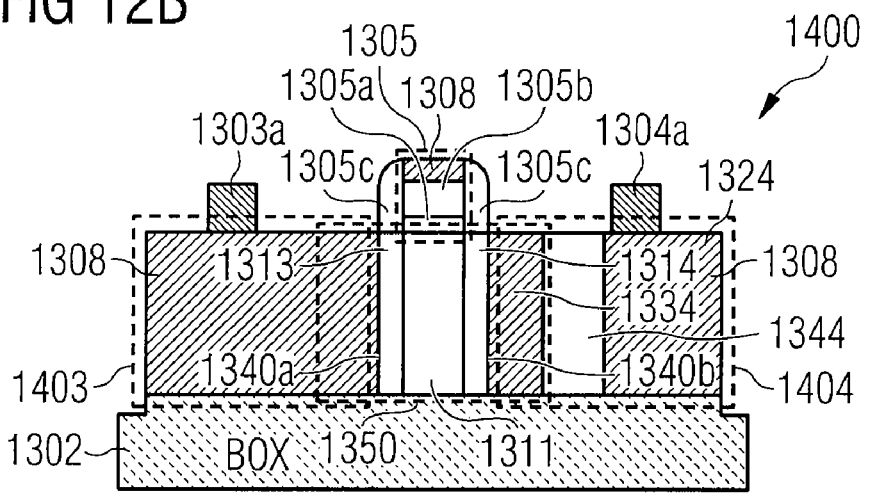
FIG. 12B shows a cross-sectional view of the field effect transistor arrangement shown in FIG. 12A.

Clearly, the field effect transistor arrangement 1400' shown in FIG. 12A and/or the corresponding field effect transistors 1400 shown in FIG. 12B have an asymmetric device design, where an unsilicided current ballasting region 1344 is formed only in the second source/drain region 1404 while the first source/drain region 1403 is formed as a fully silicided region. In other words, the first source/drain region 1403 is fully silicided, while the second source/drain region 1404 is selectively fully silicided.

FIGS. 12A and 12B thus show a device design, where one device side (according to the embodiment shown, the side of the device including the second source/drain region 1404) includes a source/drain link region containing metal (i.e. the second metallically conductive region 1334) for good and local heat absorption, a Schottky junction to the channel region (i.e. the second Schottky junction 1340*b*) for low ESD breakdown voltage and a silicide blocking region (i.e. the current ballasting region 1344) for uniform current spreading during ESD. The opposite device side (according to the embodiment shown, the side of the device including the first source/drain region 1403) includes a full metal region (i.e. the fully silicided first source/drain region 1403) for optimized thermal properties.

Figure 13:
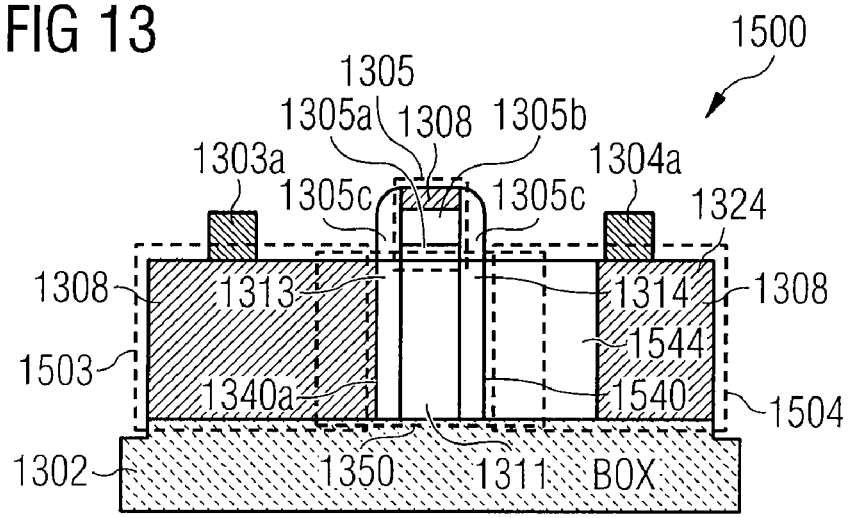
FIG. 13 to FIG. 18 show schematic cross-sectional views of field effect transistors in accordance with certain embodiments of the invention.

FIG. 13 shows a schematic cross-sectional view of a field effect transistor 1500 in accordance with another embodiment of the invention, the field effect transistor 1500 including a first source/drain region 1503 and a second source/drain region 1504. The field effect transistor 1500 is different from the field effect transistor 1400 shown in FIG. 12B, in that in the second source/drain region 1504 of the field effect transistor 1500 a highly doped (e.g. n+ doped) current ballasting region 1544 is formed adjacent to the second lightly doped region 1314. Thus, on one side of the field effect transistor 1500 (according to the embodiment shown, on the side of the second source/drain region 1504) a conventional junction 1540 is formed between the current ballasting region 1544 and the second lightly doped region 1314, instead of the second Schottky barrier junction 1340*b* of the field effect transistor shown in FIG. 12B. In other words, in the embodiment shown in FIG. 13, a Schottky barrier 1340*a* is formed only between the fully silicided first source/drain region 1503 and the lightly doped region 1313 (e.g. n-doped halo/extension region), whereas a conventional junction 1540 is formed between the highly doped current ballasting region 1544 and the adjacent second lightly doped region 1314.

One advantage of the embodiment shown in FIG. 13 can be seen in that the conventional type junction 1540 on one side of the field effect transistor 1500 allows for a higher breakdown voltage as may be required, for example, for high voltage IO applications. The local cooling may still be provided from the opposite device side, that is according to the embodiment shown, from the side of the first source/drain region 1303.

Figure 14:
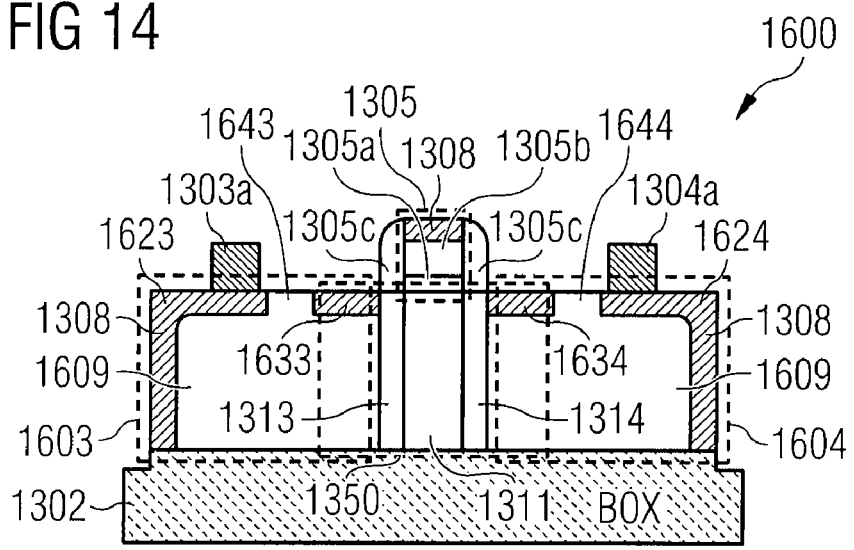

FIG. 14 shows a field effect transistor 1600 in accordance with another embodiment of the invention, the field effect transistor 1600 including a first source/drain region 1603 and a second source/drain region 1604. A metallically conductive region 1633 is formed within a part of the first source/drain region 1603, and a second metallically conductive region 1634 is formed within a part of the second source/drain region 1604. The metallically conductive region 1633 and the second metallically conductive region 1634 are both formed as silicided regions. Thus, the portions of the source/drain regions 1603, 1604 that are located within the fin structure 1350 (referred to as the source/drain link regions of the source/drain regions) are surface-silicided. In other words, the field effect transistor 1600 shown in FIG. 14 includes surface-silicided source/drain link regions (that is, the metallically conductive regions 1633, 1634 are merely formed in surface areas of the respective source/drain link regions), in contrast to the field effect transistor 1300 which includes fully silicided source/drain link regions 1333, 1334. The first source/drain region 1603 of the field effect transistor 1600 further includes a silicided source/drain contact region 1623, and the second source/drain region 1604 further includes a silicided second source/drain contact region 1624.

The field effect transistor 1600 is different from the field effect transistor 1300 shown in FIG. 11B in that both the source/drain contact regions 1623, 1624 and the source/drain link regions are formed as surface-silicided regions, and not, as is the case with the field effect transistor 1300 shown in FIG. 11B, as fully silicided regions. Thus, the first source/drain region 1603 and the second source/drain region 1604 include silicided source/drain contact regions 1623, 1624 and silicided source/drain link regions with silicided regions 1633, 1634 formed within surface areas of the respective source/drain link region, wherein in each case an unsilicided, highly doped ballasting region 1643, 1644 is formed between the respective source/drain contact region and the respective source/drain link region. Alternatively, the ballasting regions 1643, 1644 may be lowly doped.

The silicided source/drain contact region 1623 is formed in a first surface area of the first source/drain region 1603, and the silicided region 1633 (metallically conductive region 1633) is formed in a second surface area of the first source/drain region 1603, adjacent to the lightly doped region 1313, thereby forming a surface-silicided source/drain link region in the first source/drain region 1603. Analogously, the silicided second source/drain contact region 1624 is formed in a first surface area of the second source/drain region 1604, and the silicided region 1634 (second metallically conductive region 1634) is formed in a second surface area of the second source/drain region 1604, adjacent to the second lightly doped region 1314, thereby forming a silicided second source/drain link region in the second source/drain region 1604. The source/drain contact regions 1623, 1624 and the silicided regions 1633, 1634 (metallically conductive regions 1633, 1634) are formed by conventional, i.e. surface silicidation of the source/drain regions 1603, 1604, leaving core regions 1609 of the source/drain regions 1603, 1604 unsilicided. The core regions 1609 may be highly doped, e.g. n+ doped. Alternatively, the core regions 1609 may be lowly doped, e.g. n− doped. As in the embodiment shown in FIG. 11B, the silicidation of the field effect transistor 1600 is blocked in a first region between the silicided source/drain contact region 1623 and the silicided region 1633 (metallically conductive region 1633), and also in a second region between the silicided second source/drain contact region 1624 and the silicided region 1634 (second metallically conductive region 1634), such that a highly doped unsilicided current ballasting region 1644 is formed between the silicided second source/drain contact region 1624 and the surface-silicided second source/drain link region (including the second metallically conductive region 1634) and a highly doped unsilicided second current ballasting region 1643 is formed between the silicided source/drain contact region 1623 and the surface-silicided source/drain link region (including the metallically conductive region 1633).

Figure 15A:
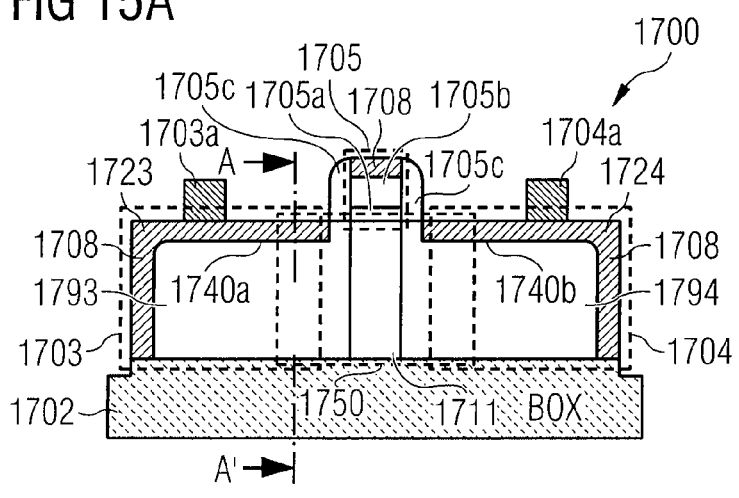

FIG. 15A shows a schematic cross-section of a field effect transistor 1700 with a fin structure 1750 in accordance with another embodiment of the invention. The field effect transistor 1700 is formed on a buried oxide (BOX) layer 1702 and includes a first source/drain region 1703 and a second source/drain region 1704. A body region 1711 is formed within the fin structure 1750 and between the first source/drain region 1703 and the second source/drain region 1704. A metallically conductive region 1723 is formed within a surface area of the first source/drain region 1703, and a second metallically conductive region 1724 is formed within a surface area of the second source/drain region 1704.

The first source/drain region 1703 includes a core region 1793 which has a dopant concentration such that a Schottky barrier 1740a is formed between the core region 1793 and the metallically conductive region 1723. The second source/drain region 1704 includes a second core region 1794 which has a dopant concentration such that a second Schottky barrier 1740b is formed between the second core region 1794 and the second metallically conductive region 1724.

The body region 1711 is formed between the core region 1793 and the second core region 1794. That is, the core region 1793 is adjacent to a first side of the body region 1711, and the second core region 1794 is adjacent to a second side of the body region 1711, the second side being opposite to the first side of the body region 1711.

A first electrical contact 1703a is formed on the metallically conductive region 1723 (also referred to as source/drain contact region 1723) for electrically contacting the first source/drain region 1703, and a second electrical contact 1704a is formed on the second metallically conductive region 1724 (also referred to as second source/drain contact region 1724) for electrically contacting the second source/drain region 1704.

The field effect transistor 1700 further includes a gate region (or gate) 1705 which is formed on the body region 1711. The gate region 1705 includes a gate-insulating layer 1705a formed on the body region 1711, and a conductive gate layer 1705b disposed on the gate insulating layer 1705a. The gate 1705 is silicided, that is, a silicide layer 1708 is formed within a top region of the conductive gate layer 1705b. The field effect transistor 1700 further includes gate sidewall spacers 1705c formed at the sidewalls of the gate region 1705.

The metallically conductive region 1723 and the second metallically conductive region 1724 are both formed as silicided regions by surface silicidation. In other words, the first source/drain region 1703 is surface-silicided, thereby forming the metallically conductive region 1723 within a surface area of the first source/drain region 1703. Analogously, the second metallically conductive region 1724 is formed by surface silicidation of the second source/drain region 1704. That is, the second source/drain region 1704 is surface-silicided, thereby forming the second metallically conductive region 1724 within a surface area of the second source/drain region 1704. Thus, the metallically conductive region (source/drain contact region) 1723 and the second metallically conductive region (second source/drain contact region) 1724 both include silicide material 1708.

The core region 1793 formed within the first source/drain region 1703 and the second core region 1794 formed within the second source/drain region 1704 are lightly doped (for example, according to one embodiment of the invention, lightly n− doped, e.g. n− doped, if the field effect transistor 1700 is configured as an NMOS field effect transistor) with dopants, wherein the doping of the core region 1793 and the second core region 1794 can be achieved, for example, by a halo implantation or an extension implantation. In other words, the core region 1793 and the second core region 1794 may include halo or extension implants (e.g. n-halo/extension implants).

The body region 1711 may include silicon material with any doping.

Figure 15B:
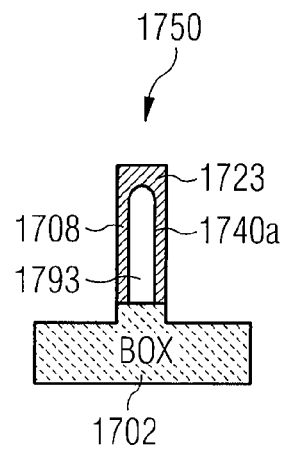

The surface silicidation of the fin structure 1750 can also be seen in FIG. 15B which shows a cross-sectional view of the field effect transistor 1700 along the dashed line A-A' in FIG. 15A, that is a cross-section through the fin 1750 at the side of the first source/drain region 1703 (more specifically, FIG. 15B shows a cross-section through the source/drain link region of the first source/drain region 1703). FIG. 15B shows that the silicidation of the fin 1750 only occurs at the exposed surface of the fin 1750, thereby forming the silicided source/drain contact region 1723 and leaving the core region 1793 of the fin 1750 unsilicided. The core region 1793 is lightly doped, such that the Schottky barrier 1740A is formed between the metallically conductive region 1723 and the core region 1793. In other words, a Schottky barrier junction 1740a is formed at the interface of the core region 1793 and the source/drain contact region 1723.

Clearly, the field effect transistor device 1700 can be created in a process having standard silicidation (i.e. silicidation is only occurring at the exposed silicon surfaces). Thus, a silicon core exists inside the silicided fin 1750. While using source/drain implants leads to a standard device (cf. FIG. 8B) with no Schottky barrier junctions, in the novel Schottky FinFET device 1700 shown in FIG. 15A, the source/drain implants can be omitted and thus process costs can be reduced. In the FinFET device 1700, Schottky barriers 1740a, 1740b are formed between the silicide 1708 of the metallically conductive regions 1723, 1724 and the lightly doped core regions 1793, 1794.

Clearly, FIG. 15A shows a FinFET device 1700 with omitted source/drain implants (e.g. n+ implants), having a channel region (formed under the gate 1705), and having large-area Schottky barriers 1740a, 1740b formed within the source/drain regions 1703, 1704, between silicided source/drain contact regions 1723, 1724 and unsilicided core regions 1793, 1794. Thus, the field effect transistor 1700 includes large-area Schottky contacts.

Figure 16:
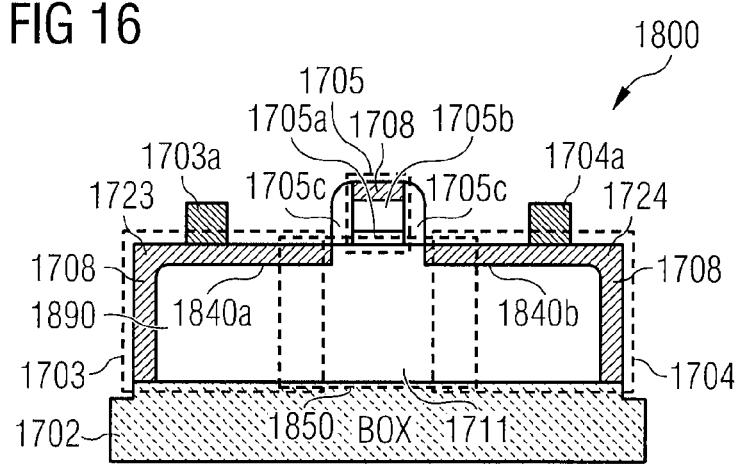

FIG. 16 shows a cross-sectional view of a field effect transistor 1800 with a fin structure 1850 in accordance with another embodiment of the invention. The field effect transistor 1800 is different from the field effect transistor 1700 shown in FIG. 15A, in that a core region 1890 is formed within the first source/drain region 1703 and the second source/drain region 1704 and within the fin structure 1850, wherein the core region 1890 has approximately the same dopant concentration as the body region 1711, which is a part of the core region 1890. In other words, the field effect transistor 1800 includes a common core region 1890 formed within the source/drain regions 1703, 1704 and within the fin structure 1850, the core region 1890 having such a dopant concentration that Schottky barriers 1840a, 1840b are formed between the core region 1890 and the metallically conductive regions 1723, 1724. In particular, a Schottky barrier 1840a is formed between the core region 1890 and the metallically conductive region 1723 in the first source/drain region 1703, and a second Schottky barrier 1840b is formed between the core region 1890 and the second metallically conductive region 1724 in the second source/drain region 1704.

Clearly, FIG. 16 shows a FinFET device 1800 with omitted source/drain implants (e.g. n+ implants) and omitted n-extension implants, and further having a Schottky barrier 1840a formed at the interface between the core region 1890 and the metallically conductive region 1723, and a second Schottky barrier 1840b formed at the interface between the core region 1890 and the second metallically conductive region 1724. Again, as is the case with the field effect transistor 1700 shown in FIG. 15A, large-area Schottky contacts are formed within the device structure of the FinFET device 1800.

Figure 17:
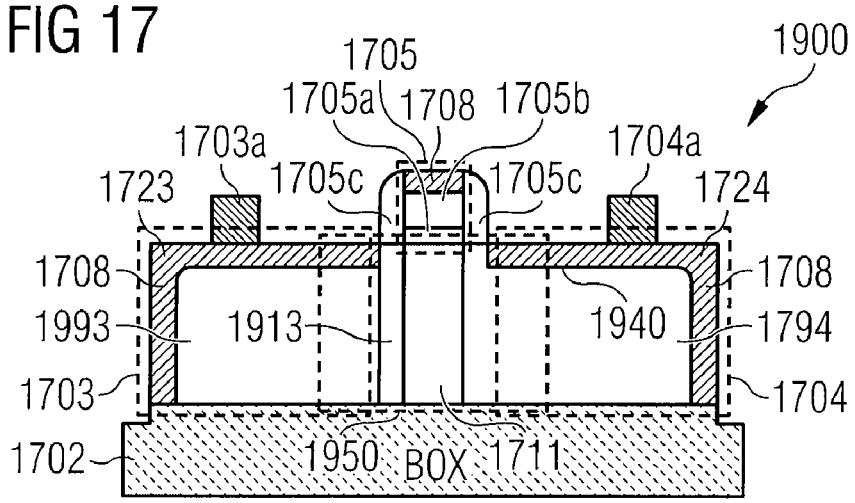

FIG. 17 shows a cross-sectional view of a field effect transistor 1900 with a fin structure 1950 in accordance with another embodiment of the invention. The field effect transistor 1900 is different from the field effect transistor 1700 shown in FIG. 15A, in that a Schottky barrier junction 1940 is formed only on one side of the field effect transistor 1900, according to the embodiment shown on the side of the second source/drain region 1704, while a core region 1993 within the first source/drain region 1703 of the field effect transistor 1900 is heavily doped (e.g. n+ doped) with dopants, for example heavily doped with source/drain implants. In other words, the first source/drain region 1703 includes conventional heavy doping of the core region 1993 of the first source/drain region 1703 and surface silicidation of the first source/drain region 1703, thereby forming the silicided source/drain contact region 1723.

The field effect transistor 1900 further includes a lightly doped region 1913 formed between the heavily doped core region 1993 and the body region 1711, the lightly doped region being, for example, configured as a halo or extension region.

Clearly, FIG. 17 shows an asymmetric device design 1900. That is, a FinFET device 1900 with a single-sided Schottky barrier 1940 formed between the second core region 1794 and the second metallically conductive region 1724 (second source/drain contact region 1724).

Advantages of the asymmetric device design 1900 shown in FIG. 17 can be seen in that, for example, the heavily doped (e.g. n+ doped) core region 1993 on the left device side, that is on the side of the first source/drain region 1703, can be used as an advantageously high doped emitter region for forming a parasitic bipolar transistor, and that the metal-semiconductor junction (i.e. the Schottky barrier junction 1940) on the right device side, that is on the side of the second source/drain region 1704, to the silicon core 1794 with low halo-doping can benefit from a reduced ESD breakdown voltage.

Clearly, the embodiments shown in FIG. 15A to FIG. 17 represent novel MuGFET devices created in a process having standard silicidation (i.e. silicidation is only occurring at the exposed silicon surfaces). In all cases a silicon core exists inside the silicided fins. In the embodiment shown in FIG. 15A, the source/drain implants (e.g. n+ implants) are omitted and thus process costs are saved. Large-area Schottky barriers are formed between the silicide and the region(s) lightly doped with, for example, n– halo or extension implants. In the embodiment shown in FIG. 16, also the halo/extension implants are omitted (thus, for example, saving further on process costs). The embodiment shown in FIG. 17 has an asymmetric device design where, for example, the highly (e.g., n+) doped region on the left device side could be used as an advantageously high doped emitter region, and where the metal-semiconductor junction (on the right device side) to the silicon core with low halo-doping would benefit from a reduced ESD breakdown voltage.

Figure 18:
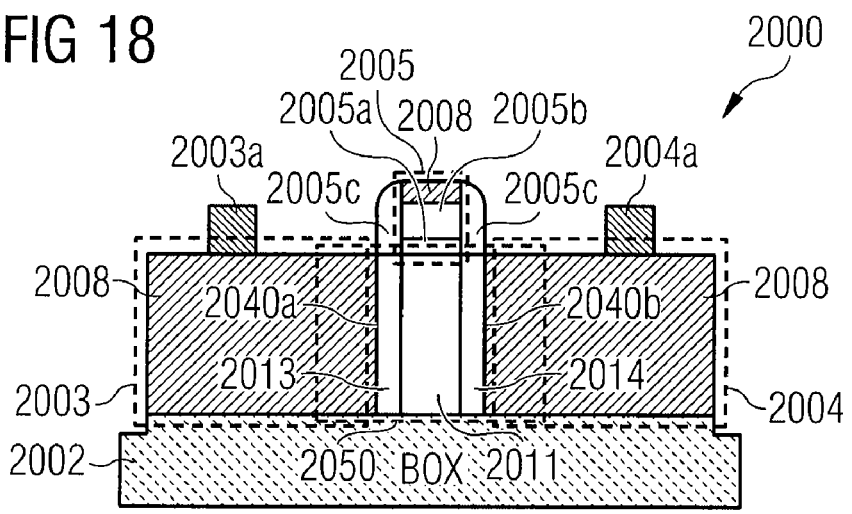

FIG. 18 shows a cross-sectional view of a field effect transistor 2000 with a fin structure 2050 in accordance with another embodiment of the invention. The field effect transistor 2000 is formed on a buried oxide (BOX) layer 2002 and includes a first source/drain region 2003 and a second source/drain region 2004, wherein the first source/drain region 2003 and the second source/drain drain region 2004 are formed as metallically conductive regions. According to the embodiment shown, the first source/drain region 2003 is formed as a fully silicided region, and the second source/drain region 2004 is also formed as a fully silicided region.

The field effect transistor 2000 further includes a body region 2011 which is formed within the fin structure 2050 and between the first source/drain region 2003 and the second source/drain region 2004. Furthermore, the first source/drain region 2003 is adjacent to a lightly doped region 2013 disposed between the body region 2011 and the first source/drain region 2003, while the second source/drain region 2004 is adjacent to a second lightly doped region 2014 disposed between the body region 2011 and the second source/drain region 2004. The lightly doped region 2013 may be formed as a halo region or as an extension region, and the second lightly doped region 2014 may also be formed as a halo region or as an extension region.

A Schottky barrier 2040a is formed between the first source/drain region 2003 and the lightly doped region 2013, and a second Schottky barrier 2040b is formed between the second source/drain region 2004 and the second lightly doped region 2014. A first electrical contact 2003a is formed on the first source/drain region 2003 for electrically contacting the first source/drain region 2003, and a second electrical contact 2004a is formed on the second source/drain region 2004 for electrically contacting the second source/drain region 2004. A gate region 2005 is formed on the body region 2011, the gate region 2005 including a gate-insulating layer 2005a formed on the body region 2011, and a conductive gate layer 2005b formed on the gate-insulating layer 2005a, wherein the gate region 2005 is silicided, that is, a silicide layer 2008 is formed within a top region of the conductive gate layer 2005b. According to an alternative embodiment, the gate region 2005 is fully silicided. That is, in this embodiment the conductive gate layer 2005b is entirely transformed into a silicide. Sidewall spacers 2005c are formed at the sidewalls of the gate region 2005.

Clearly, FIG. 18 shows an embodiment of a FinFET or MuGFET device 2000 with full silicidation and Schottky barriers 2040a, 2040b formed between the source/drain regions 2003, 2004 and adjacent lightly doped regions 2013, 2014 (e.g. halo/extension regions). In other words, the field effect transistor device 2000 shown in FIG. 18 includes fully silicided source/drain regions 2003, 2004. The field effect transistor 2000 can also be called a FuSi FinFET. The FinFET 2000 can be realized by omitting all source/drain implants (e.g., omitting all n+ implants) but applying halo/extension implants (e.g., n− halo/extension implants), thereby forming lightly doped (e.g. n− doped) halo/extension regions 2013, 2014 adjacent to the body region 2011. The first source/drain region 2003 and the second source/drain region 2004 of the field effect transistor 2000 are fully silicided, in other words, the source/drain regions 2003, 2004 are entirely transformed into a silicide 2008. Thus, the Schottky barrier 2040a is formed between the metallic first source/drain region 2003 and the halo/extension region 2013, and the second Schottky barrier 2040b is formed between the metallic second source/drain region 2004 and the second halo/extension region 2014.

Figure 19:
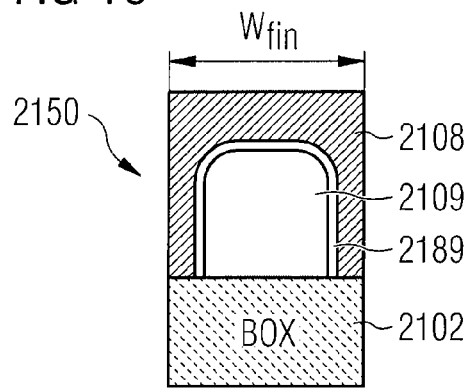
FIG. 19 shows a schematic cross-sectional view of a fin structure.

FIG. 19 shows a cross-sectional view of a fin structure 2150 with conventional surface silicidation. The fin 2150 is formed on a buried oxide (BOX) layer 2102 and includes a silicon core region 2109 and a silicide layer 2108 formed in a surface area of the fin structure 2150 and having a common interface 2189 with the silicon core region 2109. The width of the fin structure 2150 is indicated in FIG. 19 by the double arrow labelled $W_{fin}$.

FIG. 20A to FIG. 20E show fin structures with different widths $W_{fin,i}$ (i=1, ..., 5) for illustrating a method of siliciding a fin structure in accordance with an embodiment of the invention. Each of the fin structures shown in FIG. 20A to FIG. 20E is formed on a buried oxide (BOX) layer 2202.

For simplicity of illustration, the interface 2189 shown in FIG. 19 is left out in FIGS. 20A to 20E.

Figure 20A:
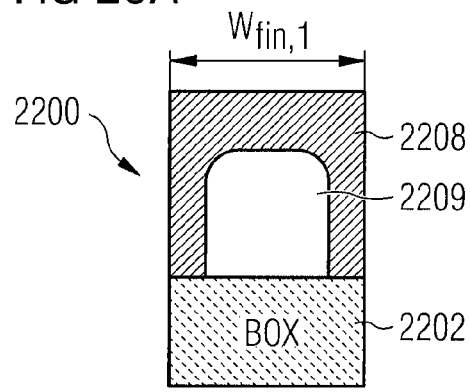
FIG. 20A to FIG. 20E show schematic cross-sectional views of fin structures for illustrating a method of siliciding a fin structure in accordance with an embodiment of the invention.

FIG. 20A shows a first fin structure 2200 having a first value $W_{fin,1}$ of the fin width. The fin structure 2200 includes a silicon core region 2209 as well as a silicided region 2208 formed in a surface area of the fin structure 2200.

Figure 20B:
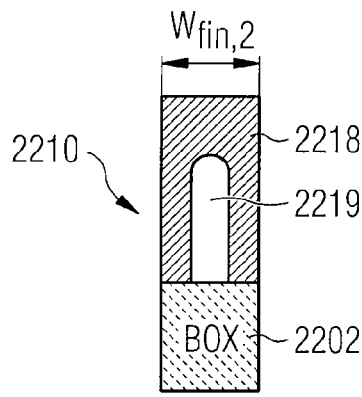

FIG. 20B shows a second fin structure 2210 having a second value $W_{fin,2}$ of the fin width, $W_{fin,2}$ being smaller than the fin width $W_{fin,1}$ of the first fin structure 2200. The second fin structure 2210 also includes a silicon core region 2219 and a silicided region 2218. However, the silicon core region 2219 of the second fin structure 2200 is thinner than the silicon core 2209 of the first fin structure 2200, while the thickness of the silicide 2218 formed at the top surface and at the sidewalls of the second fin 2210 is approximately the same as in the first fin structure 2200. Clearly, since the second fin structure 2210 is thinner than the first fin structure 2200, the silicide 2218 formed during the silicidation of the second fin structure 2210 has consumed more material of the silicon fin 2210 (relative to the total fin volume) than is the case with the thicker first fin structure 2200 of FIG. 20A.

Figure 20C:
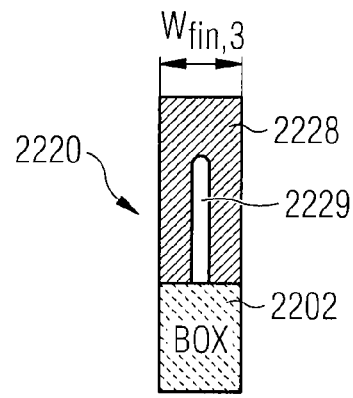

FIG. 20C shows a third fin structure 2220 having a third value $W_{fin,3}$ of the fin width which is still smaller than the fin width $W_{fin,2}$ of the second fin structure 2210. Therefore, the silicon core region 2229 remaining in the third fin structure 2220 during silicidation of the third fin structure 2220 is even thinner than the core region 2219 of the second fin structure 2210, while the thickness of the silicide 2228 formed at the fin sidewalls is approximately the same as in the second fin structure 2210. Clearly, during silicidation of the third fin structure 2220 the silicide material 2228 has consumed more silicon material of the third fin structure 2220 (relative to the fin volume) as is the case with the second fin structure 2210 shown in FIG. 20B.

Figure 20D:
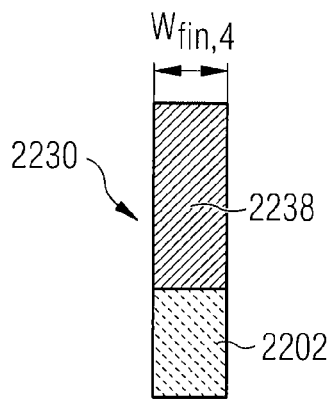

FIG. 20D shows a fourth fin structure 2230 having a fourth value $W_{fin,4}$ of the fin width which is smaller than the fin width $W_{fin,3}$ of the third fin structure 2220. As can be seen from FIG. 20D, the silicide material 2238 has consumed the whole silicon material of the fourth fin structure 2230, such that no silicon core remains within the fourth fin structure 2230. In other words, the fourth fin structure 2230 is fully silicided. To put it in still other words, the fourth fin structure 2230 is narrow enough such that during the silicidation process the silicon material of the fourth fin structure 2230 is completely transformed into a silicide 2238.

Figure 20E:
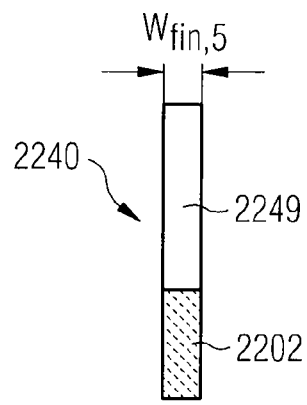

Clearly, FIG. 20A to FIG. 20D show that the transition from a fin structure having a silicon core to a fully silicided fin structure can be determined or controlled by the width $W_{fin}$ of the fin and by the thickness of the silicide formed at the fin sidewalls. In this context, it has to be pointed out that a very narrow fin may lead to insufficient (i.e. no) silicide formation, as is shown in FIG. 20E. This may be attributed to the fact, that a minimum width of silicon needs to be available to accommodate the size of crystal grains of the silicide.

FIG. 20E shows a fifth fin structure 2240 having a fifth value $W_{fin,5}$ of the fin width which is smaller than the fin width $W_{fin,4}$ of the fourth fin structure 2230 shown in FIG. 20D. As can be seen in FIG. 20E, due to the very narrow fin width $W_{fin,5}$ of the fifth fin structure 2240, no silicide is formed within the fifth fin structure 2240, thus leaving an unsilicided silicon core 2249 in the fifth fin 2240.

Clearly FIG. 20A to FIG. 20E show that during the silicidation of a fin structure (or at least a part of the fin structure), the degree of silicidation of the silicided part of the fin structure can be controlled by the geometrical fin width whose value $W_{fin}$ can be predetermined when providing, in other words forming, the fin structure.

According to other embodiments of the invention, the degree of silicidation of the silicided part of the fin structure, can alternatively can be controlled by the material or materials used for silicidation. This is due to the fact that different types of silicide may consume different amounts of silicon during silicidation.

Figure 21:
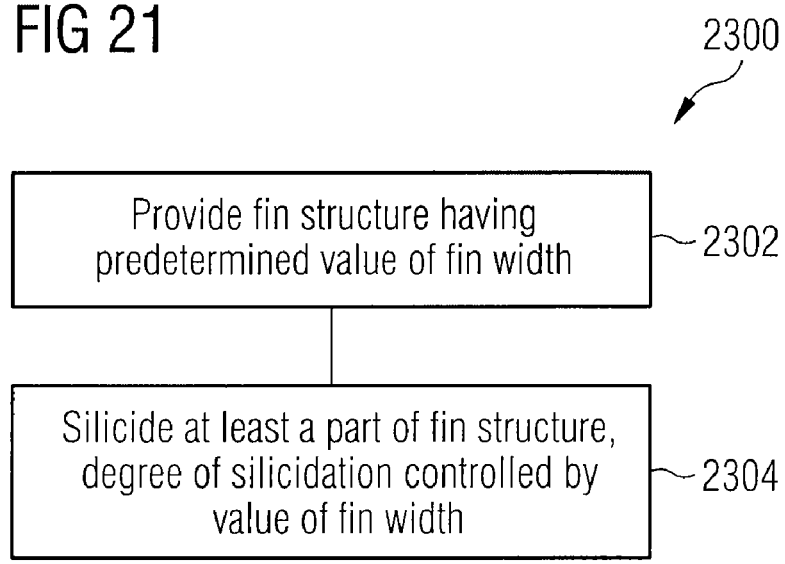
FIG. 21 is a block diagram showing a method of siliciding a fin structure in accordance with an embodiment of the invention.

Referring to FIG. 21, a method of siliciding a fin structure in accordance with an embodiment of the invention is described. At the start of the method 2300, a fin structure having a predetermined value of the fin width is provided in step 2302. The fin structure may have been fabricated on a semiconductor wafer, for example on an insulating layer (e.g. BOX layer), or on any other suitable substrate. During fabrication of the fin structure, the geometrical fin width, in general the geometric dimensions of the fin, may have been determined by suitable structuring techniques, such as e.g. lithography or etch processes.

In step 2304, at least a part of the fin structure is silicided. This may involve applying conventional techniques for the creation of a silicide layer, such as e.g. sputtering methods or chemical vapour deposition (CVD) methods. The degree of silicidation of the silicided part of the fin structure is controlled by the value of the fin width, which value has been predetermined in step 2302. Alternatively or additionally, the degree of silicidation may be controlled by the material or materials used (e.g. the metal/s used during sputtering) for silicidation and/or by the optimization of the silicidation process (e.g. thickness of the initially sputtered metal, thermal process steps).

Figure 22:
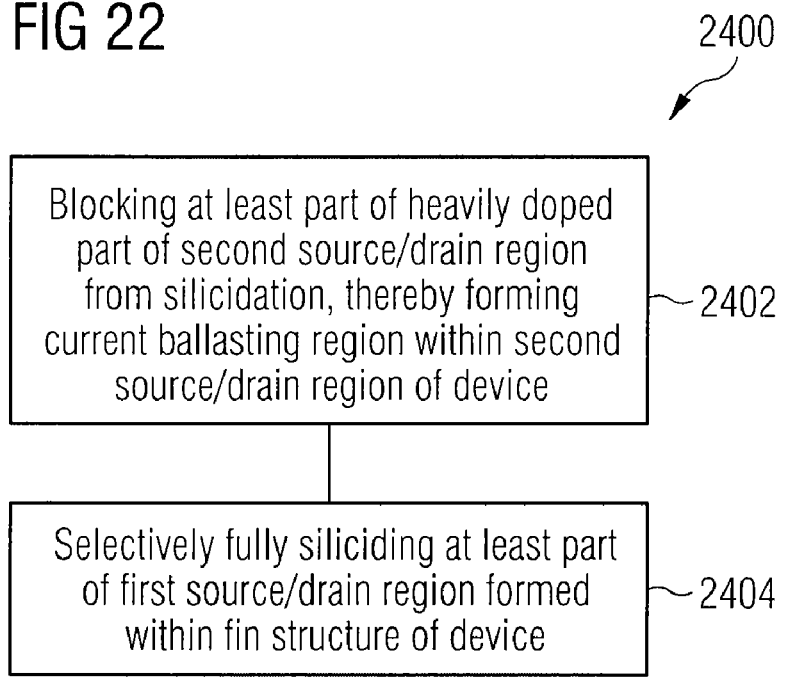
FIG. 22 is a block diagram showing a method of fabricating an ESD-robust device in accordance with an embodiment of the invention.

Referring to FIG. 22, a method of fabricating an ESD-robust device in accordance with an embodiment of the invention is described. At the start of the method 2400 a device has been provided, the device having a first and a second source/drain region, and furthermore having a fin structure. The device may be configured as a field effect transistor with a fin structure, wherein the fin structure is based upon silicon material.

In step 2402 at least a part of a heavily doped part of the second source/drain region is blocked from silicidation, thereby forming a current ballasting region within the second source/drain region. For example, the second source/drain region may be heavily doped (e.g. with source/drain implants), and a part (or region) of the second source/drain region may be blocked (for example by means of a silicide blocking mask) during a subsequent silicidation process such that no silicide is formed within the blocked region of the second source/drain region. The silicide-blocked region thus may form a heavily doped current ballasting region of the transistor.

In step 2404, at least a part of the first source/drain region formed within the fin structure of the device is selectively fully silicided. In other words, said part of the first source/drain region is entirely transformed into a silicide.

According to another embodiment, the selectively fully siliciding of the part of the first source/drain region includes siliciding a part of the first source/drain region adjacent to a body region of the device or to a lightly doped region formed between the first source/drain region and the body region, thereby forming a Schottky barrier junction in the device. In another embodiment, the method includes selectively fully siliciding a part of the second source/drain region adjacent to the body region or to a second lightly doped region formed between the second source/drain region and the body region, thereby forming a second Schottky barrier junction in the device.

According to another embodiment, the method further includes blocking at least a part of a heavily doped part of the first source/drain region from silicidation, thereby forming a second current ballasting region within the first source/drain region.

In the following, further aspects and advantages of exemplary embodiments of the invention will be described.

According to one embodiment of the invention a MuGFET device with selective but full silicidation for improved ESD device hardness is provided. According to an embodiment at least one of the junctions of the device is a metal-silicon Schottky junction. This device design for ESD-robust FinFETs is suitable for higher supply voltages and for applications which include but are not limited to 10 circuits.

According to one embodiment of the invention a new MuGFET device is provided, the device having a selectively fully silicided MuGFET device design. That is, parts of the source/drain regions of the field effect transistor are fully silicided. In this context, "selectively fully silicided" is to be understood that certain portions of the silicon film exist where the entire silicon film is transformed into a silicide, while other portions of the silicon film remain unsilicided silicon.

According to one embodiment of the invention at least one portion of the source/drain (S/D) region adjacent to the body region is silicided leading to the fact that at least one junction in the device is a Schottky barrier junction.

According to another embodiment of the invention, Schottky barriers are present between the drain and/or source region(s) and the channel region(s) (under the gate) taking advantage of the good thermal properties of the metallic region.

According to another embodiment of the invention an asymmetric fin design (in terms of selectively fully silicided and/or doping concentrations) for source and drain of a device is provided. For example, according to one embodiment of the invention a Schottky barrier junction is formed only on one source/drain (S/D) side (extension) of the device, e.g. only on the drain side.

According to an embodiment of the invention, the selective but full silicidation of the drain of a field effect transistor increases the contact resistance by a Schottky contact for better current ballasting during ESD and transports the heat better to the silicon pad to avoid the burn out of the thin fins at the drain side.

According to another embodiment of the invention, in processing a new MuGFET device, different fin dimensions are used for ESD-hard (in other words, ESD-robust) devices and logic devices, respectively. In other words, according to this embodiment an ESD-hard device may have a fin dimension which is different from the fin dimension of a logic device.

According to another embodiment of the invention the modulation of the transition from surface silicidation (i.e. partial silicidation of the fin) to full silicidation is achieved by the geometrical fin width and/or the optimization of the silicidation process (e.g. with respect to the thickness of the initially sputtered metal, or the thermal process steps). In other words, by means of varying the fin width, devices with and without silicon core can be realized within one and the same process technology.

According to another embodiment of the invention, during silicidation of one or more devices different types of silicide are used for logic devices and ESD/IO devices. Different types of silicide may consume different amounts of silicon (Si) during silicidation. For example, for a specific film resistance of 4 Ω/□ (Ohm/square) the final Si film thickness consumption is approximately 80 nm for $TiSi_2$, 55 nm for $CoSi_2$ and 40 nm for NiSi. On thin fins of e.g. 50 nm width no $TiSi_2$ will be formed anymore, while this may still be possible when using NiSi.

According to another embodiment of the invention the silicidation process is optimized such that
(a) the fins of logic devices are not fully silicided to obtain regular device characteristics, and
(b) the fins of ESD devices are only silicided at the drain junction to utilize the higher Schottky contact resistance and a higher thermal conduction to transport the heat away from the hot spot.

According to another embodiment of the invention the formation of one or more Schottky junctions is realized also in case of conventional surface silicidation resulting in large-area Schottky contacts for optimized device cross-section during ESD breakdown conduction.

Exemplary embodiments of the invention offer, for example, the following advantages:

Improved ESD hardness and device properties by
(a) using an asymmetric source/drain device design
(b) reduced heat in the fin due to a better (or higher) thermal conductivity and a better (or higher) thermal capacity of the silicided source/drain (S/D) region(s) as compared to silicon Provision of a Schottky contact leading to:
(a) Material-defined junction (metal-semiconductor Schottky junction) allowing for a very abrupt profile and avoiding interdiffusion of the dopants (in contrast to diffusion-defined junctions, i.e. junctions defined by implantation of dopants and diffusion)
(b) Higher contact resistance due to Schottky contact (Metal S/D) for better intrinsic current ballasting Fabrication of devices with silicon core (i.e. surface-silicided) and without silicon core (i.e. fully silicided) within one processing technology possible. Distinction possible by layout of the fin width:
(a) Device with silicon core (surface-silicided): conventional device or device with a large-area Schottky barrier to the N− halo/extension region.
(b) Device without silicon core (fully silicided): MuG-FET with at least one Schottky junction to the channel region.

Provision of a silicided gate leading to:
(a) Reduced heat in fin due to stronger cooling from the silicided gate as compared to a silicide blocked gate
(b) Less RC gate delay and faster switching as compared to a silicide blocked gate Processing advantages:
(a) No additional processing steps are required. The processing costs can be reduced by saving the N+/N− extension (P+/P−extension) processing steps and respective mask layer(s)
(b) The new ESD devices are compatible with the standard logic MuGFET process technology. In other words, the new ESD devices are compatible with existing MuGFET processes.
(c) The new ESD devices are compatible with silicon-on-insulator (SOI) devices which may be available in the same process technology.
(d) Compatibility of the ESD devices in a separate standard SOI technology. In other words, the new ESD devices are compatible with existing SOI processes.

Exemplary embodiments of the invention provide multi-gate semiconductor devices for high supply voltages which can be used, for example, in output drivers.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A field effect transistor with a fin structure, comprising:
a first and a second source/drain region;
a body region formed within the fin structure and between the first and the second source/drain region;
a first metallically conductive region formed within a part of the first source/drain region, the first metallically conductive region being adjacent to the body region or to a first lightly doped region disposed between the body region and the first source/drain region; and
a first current ballasting region formed within a part of the first source/drain region; and
a first source/drain contact region formed within a part of the first source/drain region;
wherein the first current ballasting region is disposed such that it separates the first metallically conductive region from the first source/drain contact region.

2. The field effect transistor as claimed in 1, wherein the first source/drain contact region includes a metallically conductive material.

3. The field effect transistor as claimed in 1, wherein the first source/drain contact region is formed as a fully silicided region.

4. The field effect transistor as claimed in 1, wherein the first source/drain contact region is formed as a silicided region in a surface area of the first source/drain region.

5. The field effect transistor as claimed in 1, further comprising:
a second metallically conductive region formed within a part of the second source/drain region.

6. The field effect transistor as claimed in 5, wherein at least one of the first metallically conductive region and the second metallically conductive region comprises silicide material.

7. The field effect transistor as claimed in 6, wherein at least one of the first metallically conductive region and the second metallically conductive region is formed as a fully silicided region.

8. The field effect transistor as claimed in 6, wherein the first metallically conductive region and the second metallically conductive region are formed in surface areas of the first and second source/drain regions, respectively.

9. The field effect transistor as claimed in 5, wherein the second metallically conductive region is formed within the entirety of the second source/drain region.

10. The field effect transistor as claimed in 5, further comprising a second current ballasting region formed within a part of the second source/drain region.

11. The field effect transistor as claimed in 10, wherein the second metallically conductive layer is adjacent to the body region or to a second lightly doped region disposed between the body region and the second source/drain region.

12. The field effect transistor as claimed in 11, further comprising:
   a second source/drain contact region formed within a part of the second source/drain region;
   wherein the second current ballasting region is disposed such that it separates the second metallically conductive region from the second source/drain contact region.

13. The field effect transistor as claimed in 12, wherein the second source/drain contact region includes a metallically conductive material.

14. The field effect transistor as claimed in 12, wherein the second source/drain contact region is formed as a fully silicided region.

15. The field effect transistor as claimed in 12, wherein the second source/drain contact region is formed as a silicided region in a surface area of the second source/drain region.

16. The field effect transistor as claimed in 1, further comprising:
   a gate region disposed on or above the body region.

17. The field effect transistor as claimed in 16, further comprising:
   a suicide layer disposed on the gate region.

18. The field effect transistor as claimed in 16, wherein the gate region comprises a polysilicon gate, the polysilicon gate being partially silicided or fully silicided.

19. The field effect transistor as claimed in 18, the gate region further comprising a metal gate, the polysilicon gate being disposed on or above the metal gate.

20. The field effect transistor as claimed in 16, wherein the fin structure comprises silicon material.

21. The field effect transistor as claimed in 20, wherein the fin structure is disposed on an electrically insulating layer.

22. The field effect transistor as claimed in 1, further comprising a second lightly doped region between the body region and the second source/drain region, wherein at least one of the first lightly doped region and the second lightly doped region is an extension region.

23. The field effect transistor as claimed in 1, further comprising a second lightly doped region between the body region and the second source/drain region, wherein at least one of the first lightly doped region and the second lightly doped region comprises a halo region.

24. A method of fabricating a field effect transistor, comprising
   forming a first and a second source/drain region;
   forming a body region within a fin structure of the field effect transistor and between the first and the second source/drain region;
   forming a gate region on or above the body region;
   forming a first metallically conductive region within a part of the first source/drain region, the first metallically conductive region being adjacent to the body region or to a first lightly doped region disposed between the body region and the first source/drain region; and
   forming a first current ballasting region within a part of the first source/drain region; and
   forming a first source/drain contact region within a part of the first source/drain region;
   wherein the first current ballasting region is disposed such that it separates the first metallically conductive region from the first source/drain contact region.

25. A field effect transistor with a fin structure, comprising:
   a first and a second source/drain region;
   a body region formed within the fin structure and between the first and the second source/drain region;
   a first current ballasting region formed within a part of the first source/drain region, the first current ballasting region being adjacent to the body region or to a first lightly doped region disposed between the body region and the first source/drain region; and
   a first metallically conductive region formed within a part of the first source/drain region, the first metallically conductive region being adjacent to the first current ballasting region;
   wherein the first metallically conductive region is formed as a fully silicided region.

26. The field effect transistor as claimed in 25, further comprising:
   a second metallically conductive region formed within a part of the second source/drain region.

27. The field effect transistor as claimed in 26, wherein the second metallically conductive region comprises silicide material.

28. The field effect transistor as claimed in 27, wherein the second metallically conductive region is formed as a fully silicided region.

29. The field effect transistor as claimed in 26, wherein the second metallically conductive region is formed within the entirety of the second source/drain region.

30. A method of fabricating a field effect transistor, comprising:
   forming a first and a second source/drain region;
   forming a body region within a fin structure of the field effect transistor and between the first and the second source/drain region;
   forming a first current ballasting region within a part of the first source/drain region, the first current ballasting region being adjacent to the body region or to a first lightly doped region disposed between the body region and the first source/drain region; and
   forming a first metallically conductive region within a part of the first source/drain region, the first metallically conductive region being adjacent to the first current ballasting region;
   wherein the first metallically conductive region is formed as a fully silicided region.

* * * * *

UNITED STATES PATENT AND TRADEMARK OFFICE
CERTIFICATE OF CORRECTION

PATENT NO. : 7,646,046 B2 Page 1 of 1
APPLICATION NO. : 11/559656
DATED : January 12, 2010
INVENTOR(S) : Christian Russ et al.

It is certified that error appears in the above-identified patent and that said Letters Patent is hereby corrected as shown below:

In the Cover Page:

At column 1, section (75), in the Inventors section, please delete "Heverlee (DE)" and insert -- Heverlee (BE) --, therefor.

In the Claims:

At column 29, line 22, in Claim 17, delete "suicide" and insert -- silicide --, therefor.

At column 29, lines 43-44, in Claim 24, delete "comprising" and insert -- comprising: --, therefor.

Signed and Sealed this

Fifteenth Day of June, 2010

David J. Kappos
*Director of the United States Patent and Trademark Office*